(12) United States Patent
Park et al.

(10) Patent No.: US 11,727,883 B2
(45) Date of Patent: Aug. 15, 2023

(54) LIGHT-EMITTING DISPLAY DEVICE HAVING SELECTIVE CAPACITOR SIZES

(71) Applicant: Samsung Display Co., LTD., Yongin-si (KR)

(72) Inventors: Jong Won Park, Yongin-si (KR); Chae Han Hyun, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/665,706

(22) Filed: Feb. 7, 2022

(65) Prior Publication Data
US 2022/0157249 A1    May 19, 2022

Related U.S. Application Data

(63) Continuation of application No. 16/813,171, filed on Mar. 9, 2020, now Pat. No. 11,244,620.

(30) Foreign Application Priority Data

Mar. 22, 2019   (KR) .................. 10-2019-0032895

(51) Int. Cl.
    *G06F 3/038*   (2013.01)
    *G09G 3/3258*  (2016.01)
    (Continued)

(52) U.S. Cl.
    CPC ......... *G09G 3/3258* (2013.01); *G09G 3/3233* (2013.01); *G09G 3/3266* (2013.01); *G09G 2300/0452* (2013.01)

(58) Field of Classification Search
    CPC .. G09G 3/3258; G09G 3/3233; G09G 3/3266; H01L 27/1255
    (Continued)

(56) References Cited

U.S. PATENT DOCUMENTS

2006/0139255 A1*  6/2006  Kim .................... G09G 3/3233
                                                      345/76
2007/0040770 A1*  2/2007  Kim .................... G09G 3/3291
                                                      345/76
(Continued)

FOREIGN PATENT DOCUMENTS

KR   10-0623728      9/2006
KR   10-2018-0088551 8/2018
(Continued)

*Primary Examiner* — Jonathan M Blancha
(74) *Attorney, Agent, or Firm* — Kile Park Reed & Houtteman PLLC

(57) ABSTRACT

A light-emitting display device includes first and second sub pixels each of which includes a driving transistor including first and second electrodes and a gate electrode, and being configured to control an electric current flowing from the first electrode to the second electrode according to a data voltage applied to a gate electrode, a light-emitting element connected to the second electrode, and a first capacitor disposed between a first sub supply voltage line to which a first supply voltage is applied and the second electrode. The first sub supply voltage line is disposed to overlap the second electrode. A capacitance of a first capacitor of the first sub pixel versus a capacitance of a first capacitor of the second sub pixel is selectively determined to correspond to an amount of the overlap between the first sub supply voltage line and the second electrode.

16 Claims, 20 Drawing Sheets

(51) Int. Cl.
*G09G 3/3266* (2016.01)
*G09G 3/3233* (2016.01)

(58) Field of Classification Search
USPC .......................................... 345/204
See application file for complete search history.

(56) References Cited

U.S. PATENT DOCUMENTS

| | | | |
|---|---|---|---|
| 2008/0088546 A1* | 4/2008 | Takasugi | G09G 3/3233 345/76 |
| 2009/0189924 A1 | 7/2009 | Ogura | |
| 2010/0149143 A1* | 6/2010 | Yamamoto | G09G 3/3233 345/205 |
| 2012/0300131 A1 | 11/2012 | Takata | |
| 2016/0087245 A1 | 3/2016 | Park et al. | |
| 2018/0182302 A1* | 6/2018 | Yoo | H01L 51/0554 |

FOREIGN PATENT DOCUMENTS

| | | |
|---|---|---|
| KR | 10-2018-0117761 | 10/2018 |
| KR | 10-2018-0131329 | 12/2018 |

* cited by examiner

LIGHT-EMITTING DISPLAY DEVICE HAVING SELECTIVE CAPACITOR SIZES

CROSS REFERENCE TO RELATED APPLICATION(S)

This is a continuation application of U.S. patent application Ser. No. 16/813,171, filed Mar. 9, 2020 (now U.S. Pat. No. 11,244,620), the disclosure of which is incorporated herein by reference in its entirety. U.S. patent application Ser. No. 16/813,171 claims priority to and benefit of Korean Patent Application No. 10-2019-0032895 under 35 U.S.C. § 119, filed on Mar. 22, 2019, in the Korean Intellectual Property Office, the entire contents of which are incorporated herein by reference.

BACKGROUND

1. Field of the Disclosure

The disclosure relates to a light-emitting display device, and more specifically, to a configuration therefor that optimizes an amount of time to deliver a driving current to a light-emitting element of a pixel in order to ensure proper display of the color of the pixel.

2. Description of the Related Art

As aspects of an information-oriented society evolve, various demands for display devices are ever increasing. For example, display devices are being employed by a variety of electronic devices such as smart phones, digital cameras, laptop computers, navigation devices, and smart televisions. Display devices may be flat panel display devices such as a liquid-crystal display device, a field emission display device, and an organic light-emitting display device. Among such flat panel display devices, an organic light-emitting display device includes a light-emitting element so that each of the pixels of the display panel can emit light by themselves. Accordingly, an organic light-emitting display device can display images without a backlight unit that supplies light to the display panel.

An organic light-emitting display device may include multiple pixels. Each of the pixels may include a light-emitting element, a driving transistor for controlling the amount of driving current supplied to the light-emitting element according to a voltage at the gate electrode, and a scan transistor for supplying a data voltage from a data line to the gate electrode of the driving transistor in response to a scan signal from a scan line. When the light-emitting element emits light with a low luminance, the driving current is small, and accordingly it may take a long time to charge the parasitic capacitance of the light-emitting element. As a result, emission of the light-emitting element may be delayed in a pixel, and the pixel may fail to represent a desired color and represent another color. As a result, the quality of the image viewed by a user may be deteriorated.

SUMMARY

Embodiments of the disclosure provide a light-emitting display device that may prevent or suppress image quality from being deteriorated.

Additional features of the disclosure will be set forth in the description which follows, and in part may be apparent from the description, or may be learned by practice of an embodiment herein.

According to an embodiment, a light-emitting display device may include a first sub pixel emitting light of a first color; and a second sub pixel emitting light of a second color, where each of the first sub pixel and the second sub pixel may include a driving transistor including a first electrode, a second electrode, and a gate electrode, and may be configured to control an electric current flowing from the first electrode to the second electrode according to a data voltage applied to a gate electrode; a light-emitting element connected to the second electrode of the driving transistor; and a first capacitor disposed between a first sub supply voltage line from which a first supply voltage is applied and the second electrode of the driving transistor, the first sub supply voltage line being disposed to overlap the second electrode of the driving transistor, and wherein a capacitance of a first capacitor of the first sub pixel versus a capacitance of a first capacitor of the second sub pixel is selectively determined to correspond to an amount of the overlap between the first sub supply voltage line and the second electrode of the driving transistor.

An area where the first sub supply voltage line overlaps with the second electrode of the driving transistor in the first sub pixel may be less than an area where the first sub supply voltage line overlaps with the second electrode of the driving transistor in the second sub pixel.

A length of a first sub supply voltage line that overlaps with the second electrode of the driving transistor in the first sub pixel may be less than a length of the first sub supply voltage line that overlaps with the second electrode of the driving transistor in the second sub pixel.

The device may further include a scan line extended in a first direction; and a data line extended in a second direction intersecting the first direction, wherein the first sub supply voltage line extends in the first direction.

The display device may further include a second sub supply voltage line electrically connected to the first sub supply voltage line, where the second sub supply voltage line extends in the second direction.

Each of the first sub pixel and the second sub pixel may include a second capacitor disposed between the first sub supply voltage line and the gate electrode of the driving transistor, and the capacitance of the first capacitor may be less than the capacitance of the second capacitor in each of the first and second sub pixels.

The device may further include a third sub pixel emitting light of a third color, wherein the third sub pixel may include the driving transistor, the light-emitting element, the first sub supply voltage line and the first capacitor, and wherein a capacitance of the first capacitor of the third sub pixel may be less than the capacitance of the first capacitor of the second sub pixel.

An area where the first sub supply voltage line overlaps with the second electrode of the driving transistor in the third sub pixel may be less than an area where the first sub supply voltage line overlaps with the second electrode of the driving transistor in the second sub pixel.

A length of the first sub supply voltage line that overlaps with the second electrode of the driving transistor in the third sub pixel may be less than a length of the first sub supply voltage line that overlaps with the second electrode of the driving transistor in the second sub pixel.

The capacitance of the first capacitor of the third sub pixel may be equal to the capacitance of the first capacitor of the first sub pixel.

An area where the first sub supply voltage line overlaps with the second electrode of the driving transistor in the third sub pixel may be equal to an area where the first sub supply voltage line overlaps with the second electrode of the driving transistor in the first sub pixel.

A length of the first sub supply voltage line that overlaps with the second electrode of the driving transistor in the third sub pixel may be equal to a length of the first sub supply voltage line that overlaps with the second electrode of the driving transistor in the first sub pixel.

The capacitance of the first capacitor of the third sub pixel may be less than the capacitance of the first capacitor of the first sub pixel.

An area where the first sub supply voltage line overlaps with the second electrode of the driving transistor in the third sub pixel may be less than an area where the first sub supply voltage line overlaps with the second electrode of the driving transistor in the first sub pixel.

A length of the first sub supply voltage line that overlaps with the second electrode of the driving transistor in the third sub pixel may be less than a length of the first sub supply voltage line that overlaps with the second electrode of the driving transistor in the first sub pixel.

The device may further include at least one insulating layer disposed between the second electrode of the driving transistor and the first sub supply voltage line.

The at least one insulating layer may include a gate insulating layer disposed on the second electrode of the driving transistor; and an interlayer dielectric layer disposed on the gate electrode of the driving transistor.

The gate electrode of the driving transistor may be disposed on the gate insulating layer.

The first sub supply voltage line may be disposed on the interlayer dielectric layer.

The second electrode of the driving transistor may be covered by the gate insulating layer.

According to the aforementioned and other embodiments of the disclosure, the capacitance of a first capacitor of a sub pixel, in which it takes a longer time to charge the parasitic capacitance than in other sub pixels, may be formed to be larger than the capacitance of the first capacitor of each of the other sub pixels. Accordingly, the charging current flowing to the parasitic capacitance in the sub pixel may be larger than the charging current flowing to the parasitic capacitance in the other sub pixels. Accordingly, it is possible to reduce the time taken to charge the parasitic capacitance in the sub pixel. Therefore, it may be possible to prevent or suppress a deterioration of the quality of the image viewed by a user.

Other features and embodiments may be apparent from the following detailed description, the drawings, and the claims.

It is to be understood that both the foregoing description and the following detailed description are not to be construed as limiting of an embodiment as described or claimed herein.

BRIEF DESCRIPTION OF THE DRAWINGS

The accompanying drawings, which are included to provide a further understanding of the disclosure, illustrate embodiments of the disclosure, in which.

DETAILED DESCRIPTION OF THE EMBODIMENTS

Figure 1:
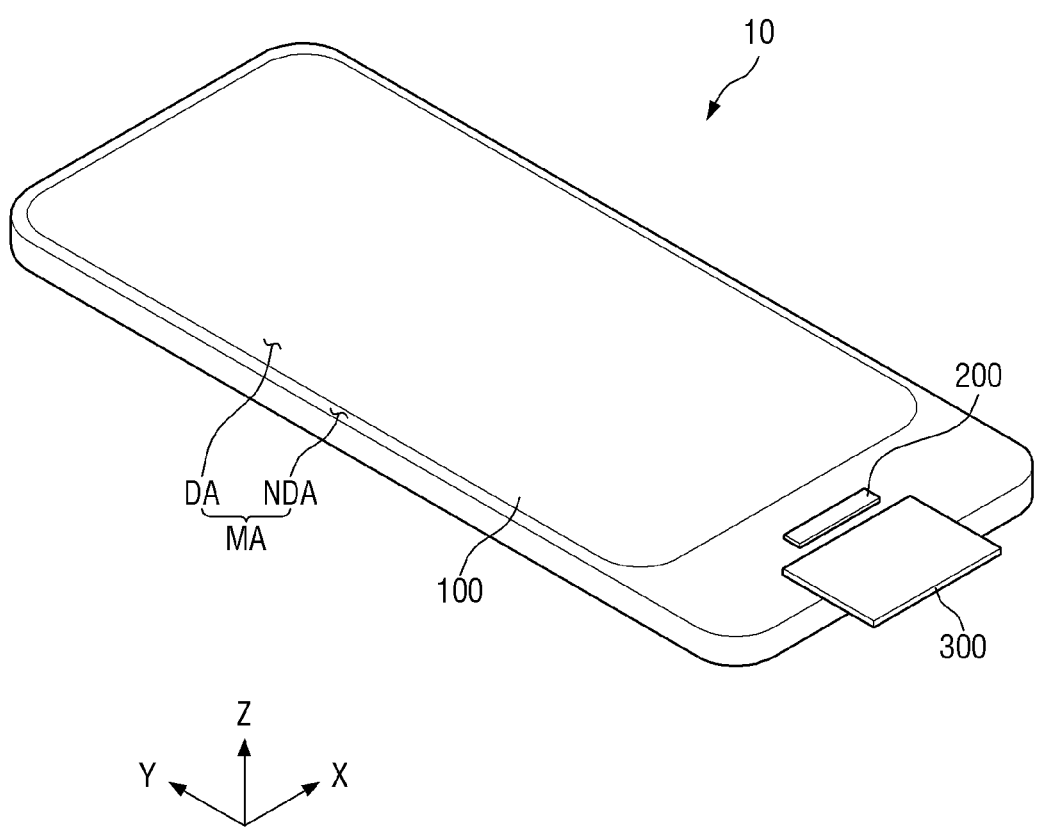
FIG. 1 illustrates a perspective view of a display device according to an embodiment of the disclosure.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Further, in the specification, the phrase "in a plan view" means when an object portion is viewed from above, and the phrase "in a cross-sectional view" means when a cross-section taken by vertically cutting an object portion is viewed from the side. Additionally, the terms "overlap" or "overlapped" mean that a first object may be above or below a second object, and vice versa. The terms "face" and "facing" mean that a first object may directly or indirectly oppose a second object. In a case in which a third object intervenes between the first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Figure 2:
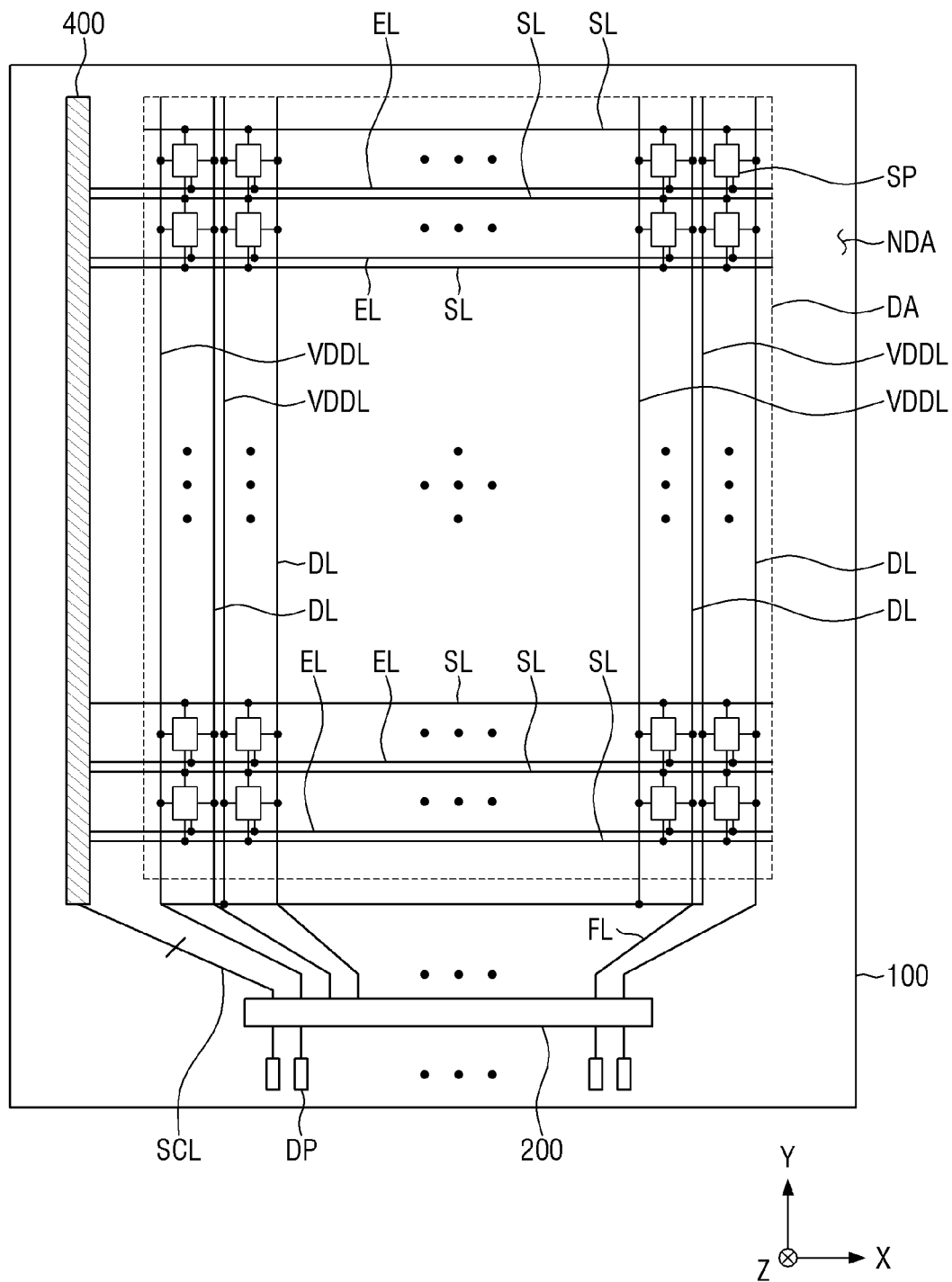
FIG. 2 illustrates a plan view showing a display device according to an embodiment of the disclosure.
Figure 3:
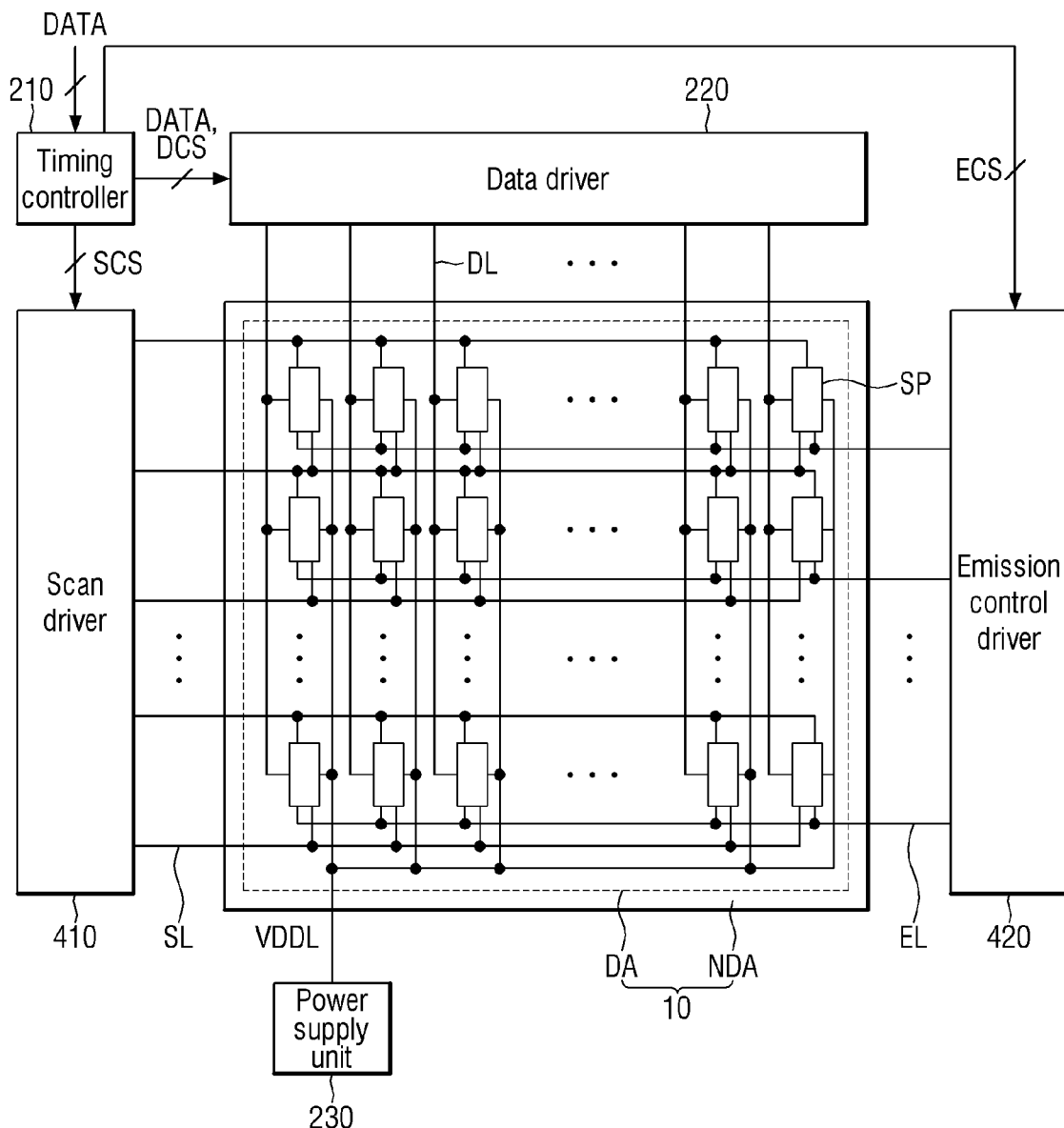
FIG. 3 illustrates a block diagram showing a display device according to an embodiment of the disclosure.

FIG. 1 is a perspective view of a display device according to an embodiment of the disclosure. FIG. 2 is a plan view showing a display device according to an embodiment of the disclosure. FIG. 3 is a block diagram showing a display device according to an embodiment of the disclosure.

As used herein, the terms "above," "top" and "upper surface" refer to the upper side of the display panel 100, i.e., the side indicated by the arrow in the z-axis direction, whereas the terms "below," "bottom" and "lower surface" refer to the lower side of the display panel 100, i.e., the opposite side in the z-axis direction. As used herein, the terms "left," "right," "upper" and "lower" sides indicate relative positions when the display panel 100 is viewed from the top. For example, the "left side" refers to the opposite direction indicated by the arrow of the x-axis, the "right side" refers to the direction indicated by the arrow of the x-axis, the "upper side" refers to the direction indicated by the arrow of the y-axis, and the "lower side" refers to the opposite direction indicated by the arrow of the y-axis.

Referring to FIGS. 1 to 3, a display device 10 may display moving images or still images. The display device 10 may be used as the display screen of portable electronic devices such as a mobile phone, a smart phone, a tablet PC, a smart watch, a watch phone, a mobile communications terminal, an electronic notebook, an electronic book, a portable multimedia player (PMP), a navigation device and an ultra mobile PC (UMPC), as well as the display screen of various products such as a television, a notebook, a monitor, a billboard and a device pertinent to the Internet of Things.

The display device 10 may be a light-emitting display device such as an organic light-emitting display device using organic light-emitting diodes, a quantum-dot light-emitting display device including quantum-dot light-emitting layer, an inorganic light-emitting display device including an inorganic semiconductor, and a micro light-emitting display device using micro light-emitting diodes (LED). In the following description, an organic light-emitting display device is described as an example of the display device 10. It is, however, to be understood that the disclosure is not limited thereto.

The display device 10 may include a display panel 100, a display driving circuit 200 and a circuit board 300.

The display panel 100 may be formed in a rectangular plane having shorter sides in a first direction (i.e., a x-axis direction) and longer sides in a second direction (i.e., a y-axis direction) intersecting the first direction. Each of the corners where the short side in the first direction meets the longer side in the second direction may be rounded with a predetermined curvature or may be a right angle. The shape of the display panel 100 when viewed from the top is not limited to a quadrangular shape, but may be formed in a different polygonal shape, a circular shape, or an elliptical shape. The display panel 100 may be, but is not limited to being, formed to be flat. The display panel 10 may include curved portions formed at left and right ends thereof and having a constant or varying curvature. In addition, the display panel 100 may be formed to be flexible so that it can be curved, bent, folded or rolled.

The display panel 100 may include a display area DA where sub pixels SP are formed to display images, and a non-display area NDA which is the peripheral area of the display area DA. In the display area DA, the scan lines SL connected to the sub pixels SP, emission lines EL, data lines DL and first supply voltage lines VDDL may be disposed besides the sub pixels SP The scan lines SL and emission lines EL may be arranged in the first direction, while the data lines DL may be arranged in the second direction intersecting the first direction. The first supply voltage lines VDDL may be arranged in parallel in the second direction in the display area DA. The first supply voltage lines VDDL formed in parallel in the second direction in the display area DA may be connected to one another in the non-display area NDA.

Each of the sub pixels SP may be connected to at least one of the scan lines SL, at least one of the data lines DL, at least one of the emission lines EL, and the respective first drive voltage line VDDL. In the example shown in FIG. 2, each of the sub pixels SP may be connected to two scan lines SL, one data line DL, one emission line EL, and the first drive voltage line VDDL. It is, however, to be understood that the disclosure is not limited thereto. For example, each of the sub pixels SP may be connected to three scan lines SL rather than two scan lines SL.

Each of the sub pixels SP may include a driving transistor, at least one transistor, a light-emitting element, and a capacitor. The transistor may be turned on in response to a scan signal from a scan line SL, so that the data voltage from the data line DL may be applied to the gate electrode of the driving transistor DT. When the data voltage is applied to the gate electrode, the driving transistor DT may supply a driving current to the light-emitting element, so that light can be emitted. The driving transistor DT and the at least one transistor ST may be thin-film transistors. The light-emitting element may emit light in accordance with the driving current from the driving transistor DT. The light-emitting element may be an organic light-emitting diode including a first electrode, an organic emitting layer, and a second electrode. The capacitor may keep the data voltage applied to the gate electrode of the driving transistor DT constant.

The non-display area NDA may be defined as the area from the outside of the display area DA to the edge of the display panel 100. The non-display area NDA, a scan driving circuit SDC for applying scan signals to the scan lines SL, fan-out lines FL between the data lines DL and the display driving circuit 200, and the pads DP connected to the display driving circuit 200 may be disposed. The display driving circuit 200 and the pads DP may be disposed at the edge on one side of the display panel 100. The pads DP may be disposed closer to the edge on the side of the display panel 100 than is the display driving circuit 200.

The scan driving circuit SDC may be connected to the display driving circuit 200 through scan control lines SCL. The scan driving circuit SDC may receive a scan control signal SCS and an emission control signal ECS from the display driving circuit 200 through the scan control lines SCL.

The scan driving circuit SDC may include a scan driver 410 and an emission control driver 420 as shown in FIG. 3.

The scan driver 410 may generate scan signals according to the scan control signal SCS and may sequentially output the scan signals to the scan lines SL. The emission control driver 420 may generate the emission control signals according to the emission control signal ECS and may sequentially output the emission control signals to the emission lines EL.

The scan driving circuit SDC may include thin-film transistors. The scan driving circuit SDC may be formed in the same layer as the thin-film transistors of the sub pixels SP. Although the scan driving circuit SDC is formed on a side of the display area DA, e.g., in the non-display area on the left side of the display area DA in FIG. 2, the disclosure is not limited thereto. For example, the scan driving circuit SDC may be formed on both side of the display area DA, e.g., in the non-display area NDA on the left side as well as right side of the display area DA.

The display driving circuit 200 may include a timing controller 210, a data driver 220, and a power supply unit 230 as shown in FIG. 3.

The timing controller 210 receives digital video data DATA and timing signals from the circuit board 300. The timing controller 210 may generate the scan control signal SCS for controlling the operation timing of the scan driver 410 according to the timing signals, may generate the emission control signal ECS for controlling the operation timing of the emission control driver 420 and may generate the data control signal DCS for controlling the operation timing of the data driver 220. The timing controller 210 may output the scan control signal SCS to the scan driver 410 through the scan control lines SCL and the emission control signal ECS to the emission control driver 420. The timing controller 210 may output the digital video data DATA and the data control signal DCS to the data driver 220.

The data driver 220 may convert the digital video data DATA into analog positive/negative data voltages and may supply them to the data lines DL through the fan-out lines FL. Sub pixels SP may be selected by the scan signals of the scan driving circuit SDC, and data voltages may be supplied to the selected sub pixels SP.

The power supply unit 230 may generate a first driving voltage to supply it to the first supply voltage line VDDL. In addition, the power supply unit 230 may generate a second driving voltage to supply it to the cathode electrodes of the organic light-emitting emitting diode of each of the sub pixels SP. The first driving voltage may be a high-level voltage for driving the organic light-emitting diode, and the second driving voltage may be a low-level voltage for driving the organic light-emitting diode. That is, the first driving voltage may have a higher level than that of the second driving voltage.

The display driving circuit 200 may be implemented as an integrated circuit (IC) and may be attached to the display panel 10 by a chip on glass (COG) technique, a chip on plastic (COP) technique, or an ultrasonic bonding. It may, however, to be understood that the disclosure is not limited thereto. For example, the display driving circuit 200 may be attached to the circuit board 300.

The circuit board 300 may be attached to the pads DP using an anisotropic conductive film. The lead lines of the circuit board 300 may be electrically connected to the pads DP. The circuit board 300 may be a flexible printed circuit board, a printed circuit board, or a flexible film such as a chip on film.

Figure 4:
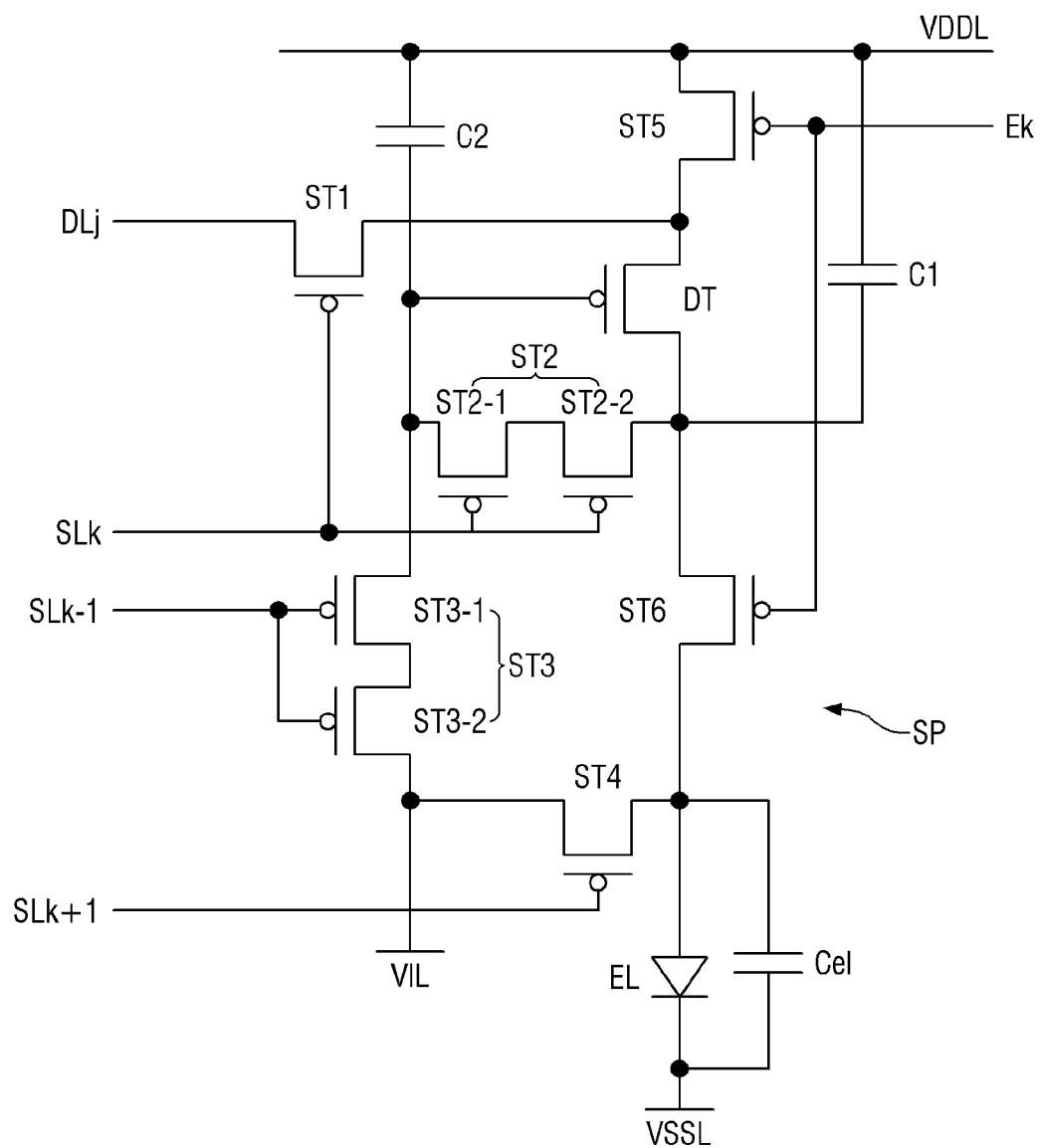
FIG. 4 illustrates a schematic diagram of an equivalent circuit of a sub pixel according to an embodiment of the disclosure.

FIG. 4 illustrates a circuit diagram showing a sub pixel according to an embodiment of the disclosure.

Referring to FIG. 4, a sub pixel SP may be connected to a (k−1)th scan line SLk−1, a kth scan line SLk, a (k+1)th scan line SLk+1, and a jth data line DLj, where k may be a positive integer equal to or greater than two and j is a positive integer. In addition, the sub pixel SP may be connected to a first supply voltage line VDDL to which the first driving voltage may be supplied, an initializing voltage line VIL to which an initializing voltage Vini may be supplied, and a second supply voltage line VSSL to which the second driving voltage may be supplied.

The sub pixel SP may include a driving transistor DT, a light-emitting element LE, switch elements, a first capacitor C1, a second capacitor C2, etc. The switch elements may include first to sixth transistors ST1, ST2, ST3, ST4, ST5 and ST6.

The drain-source current Ids (hereinafter referred to as "driving current") of driving transistor DT may be controlled according to the data voltage applied to the gate electrode. The driving current Ids flowing through the channel of the driving transistor DT may be proportional to the square of the difference between the gate-source voltage Vsg and the threshold voltage of the driving transistor DT, as shown in Equation 1 below:

$$Ids = k' \times (Vsg - Vth)^2 \qquad \text{[Equation 1]}$$

where k' denotes a proportional coefficient determined by the structure and physical properties of the driving transistor, Vsg denotes the gate-source voltage of the driving transistor, and Vth denotes the threshold voltage of the driving transistor.

The light-emitting element EL may emit light as the driving current Ids flows therein. The amount of the light emitted from the light-emitting element EL may be proportional to the driving current Ids.

The light-emitting element EL may be an organic light-emitting diode including an anode electrode, a cathode electrode, and an organic emitting layer disposed between the anode electrode and the cathode electrode. As another example, the light-emitting element EL may be an inorganic light-emitting element including an anode electrode, a cathode electrode, and an inorganic semiconductor disposed between the anode electrode and the cathode electrode. As another example, the light-emitting element EL may be a quantum-dot light-emitting element including an anode electrode, a cathode electrode, and a quantum-dot emissive layer disposed between the anode electrode and the cathode electrode. As another example, the light-emitting element EL may be a micro light-emitting diode.

The anode electrode of the light-emitting element EL may be connected to the first electrode of the fourth transistor ST4 and the second electrode of the sixth transistor ST6, while the cathode electrode thereof may be connected to the second supply voltage line VSSL. A parasitic capacitance Cel may be formed between the anode electrode and the cathode electrode of the light-emitting element EL.

The first transistor ST1 may be turned on by the scan signal of the kth scan line SLk to connect the first electrode of the drive transistor DT with the jth data line DLj. The gate electrode of the first transistor ST1 may be connected to the kth scan line SLk, the first electrode thereof may be connected to the first electrode of the driving transistor DT, and the second electrode thereof may be connected to the data line DLj.

The second transistor ST2 may be implemented as a dual transistor including a (2-1)th transistor ST2-1 and a (2-2)th transistor ST2-2. The (2-1)th transistor ST2-1 and the (2-2)th transistor ST2-2 may be turned on by the scan signal from the kth scan line SLk to connect the gate electrode with the second electrode of the drive transistor DT. That is, when the (2-1)th transistor ST2-1 and the (2-2)th transistor ST2-2 are turned on, the gate electrode of the driving transistor DT may be connected to the second electrode, and thus the driving transistor DT may function as a diode. The gate electrode of the (2-1)th transistor ST2-1 may be connected to the kth scan line SLk, the first electrode thereof may be connected to the second electrode of the (2-2)th transistor ST2-2, and the second electrode thereof may be connected to the gate electrode of the driving transistor DT. The gate electrode of the (2-2)th transistor ST2-2 may be connected to the kth scan line SLk, the first electrode thereof may be connected to the second electrode of the driving transistor DT, and the second electrode thereof may be connected to the first electrode of the (2-2)th transistor ST2-2.

The third transistor ST3 may be implemented as a dual transistor including a (3-1)th transistor ST3-1 and a (3-2)th transistor ST3-2. The (3-1)th transistor ST3-1 and the (3-2)th transistor ST3-2 may be turned on by the scan signal of the (k−1)th scan line SLk−1 to connect the gate electrode of the drive transistor DT with the initializing voltage line VIL. The gate electrode of the driving transistor DT may be discharged to the initializing voltage of the initializing voltage line VIL. The gate electrode of the (3-1)th transistor ST3-1 may be connected to the (k−1)th scan line SLk−1, the first electrode thereof may be connected to the second electrode of the driving transistor DT, and the second electrode thereof may be connected to the first electrode of the (3-2)th transistor ST3-2. The gate electrode of the (3-2)th transistor ST3-2 may be connected to the (k−1)th scan line SLk−1, the first electrode thereof may be connected to the second electrode of the (3-1)transistor ST3-1, and the second electrode thereof may be connected to the initializing voltage line VIL.

The fourth transistor ST4 may be turned on by the scan signal of the (k+1)th scan line SLk+1 to connect the anode electrode of the light-emitting element EL and the initializing voltage line VIL. The anode electrode of the light-emitting element EL may be discharged to the initializing voltage. The gate electrode of the fourth transistor ST4 may connected to the (k+1)th scan line SLk+1, the first electrode of the fourth transistor ST4 may be connected to the anode electrode of the light-emitting element EL, and the second electrode thereof may be connected to the initializing voltage line VIL.

The fifth transistor ST5 may be turned on by the emission control signal of the kth emission line Ek to connect the first electrode of the driving transistor DT with the first supply voltage line VDDL. The gate electrode of the fifth transistor ST5 may be connected to the kth emission line Ek, the first electrode thereof may be connected to the first supply voltage line VDDL, and the second electrode thereof may be connected to the source electrode of the driving transistor DT.

The sixth transistor ST6 may be connected between the second electrode of the driving transistor DT and the anode electrode of the light-emitting element EL. The sixth transistor ST6 may be turned on by the emission control signal of the kth emission line Ek to connect the second electrode of the driving transistor DT with the anode electrode of the light-emitting element EL. The gate electrode of the sixth transistor ST6 may be connected to the kth emission line Ek, the first electrode thereof may be connected to the second electrode of the driving transistor DT, and the second electrode thereof may be connected to the anode electrode of the light-emitting element EL. In a case that the fifth transistor ST5 and the sixth transistor ST6 both are turned on, the driving current Ids can be supplied to the light-emitting element EL.

The first capacitor C1 may be formed between the second electrode of the driving transistor DT and the first supply voltage line VDDL. One electrode of the first capacitor C1 may be connected to the second electrode of the driving transistor DT while the other electrode thereof may be connected to the first supply voltage line VDDL.

The second capacitor C2 may be formed between the gate electrode of the driving transistor DT and the first supply voltage line VDDL. One electrode of the second capacitor C2 may be connected to the gate electrode of the driving transistor DT while the other electrode thereof may be connected to the first supply voltage line VDDL. Since the second capacitor C2 holds the voltage at the gate electrode of the driving transistor DT for one frame period, the capacitance of the second capacitor C2 may be larger than the capacitance of the first capacitor C1.

In a case that the first electrode of each of the first to sixth transistors ST1, ST2, ST3, ST4, ST5 and ST6 and the driving transistor DT may be a source electrode, the second electrode thereof may be a drain electrode. In a case that the first electrode of each of the first to sixth transistors ST1, ST2, ST3, ST4, ST5 and ST6 and the driving transistor DT may be a drain electrode, the second electrode thereof may be a source electrode.

The active layer of each of the first to sixth transistors ST1, ST2, ST3, ST4, ST5 and ST6 and the driving transistor DT may be formed of one of poly silicon, amorphous silicon and oxide semiconductor. In a case that the semiconductor layer of each of the first to sixth transistors ST1 to ST6 and the driving transistor DT may be formed of poly silicon, a low-temperature poly silicon (LTPS) process may be employed.

Although the first to sixth transistors ST1, ST2, ST3, ST4, ST5 and ST6 and the driving transistor DT may be p-type metal oxide semiconductor field effect transistors (MOSFETs), this is merely an example. As another example, they may be of n-type MOSFETs. In a case that the first to sixth transistors ST1, ST2, ST3, ST4, ST5 and ST6 and the driving transistor DT may be formed of n-type MOSFETs, the timing diagram of FIG. 5 may be modified appropriately for the characteristics of the n-type MOSFETs.

The first driving voltage from the first supply voltage line VDDL, the second driving voltage from the second supply voltage line VSSL and the initializing voltage from the initializing voltage line Vini may be determined based on the characteristics of the driving transistor DT, the characteristics of the light-emitting element EL, etc. For example, the voltage difference between the initializing voltage and the data voltage supplied to the source electrode of the driving transistor DT may be set to be smaller than the threshold voltage of the driving transistor DT.

Figure 5:
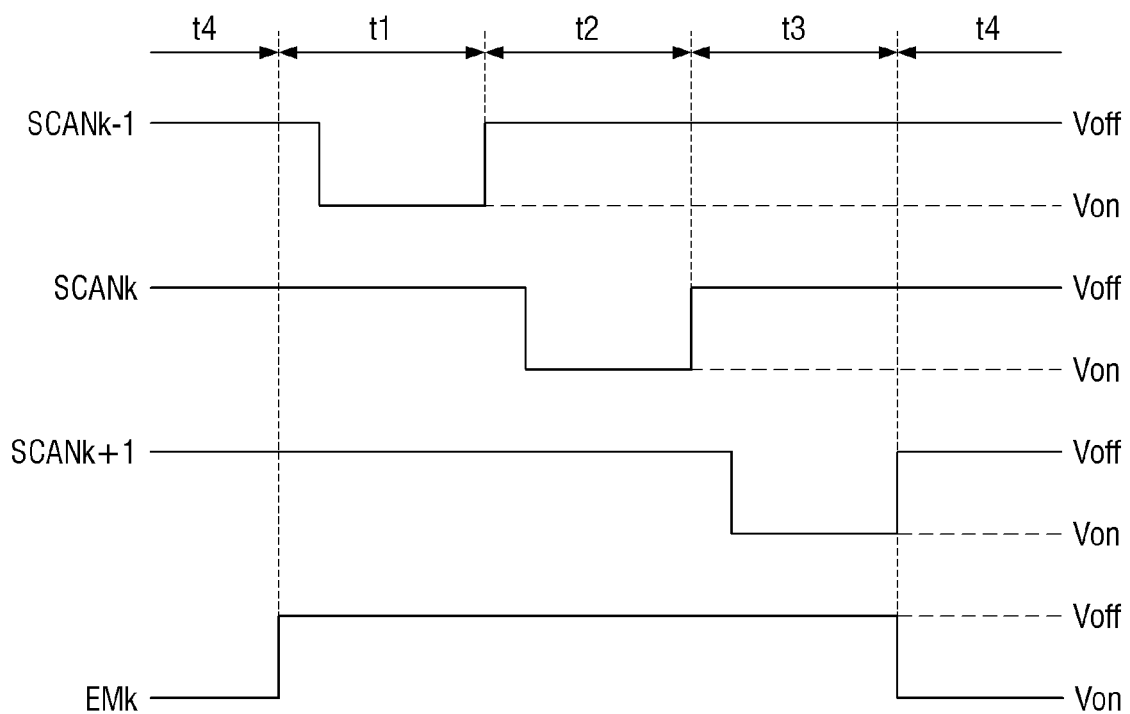
FIG. 5 illustrates a waveform diagram showing signals applied to a (k−1)th scan line, a kth scan line, a (k+1)th scan line, and a kth emission line in FIG. 4.

FIG. 5 illustrates a waveform diagram showing signals applied to the (k−1)th scan line, the kth scan line, the (k+1)th scan line, and the kth emission line in FIG. 4.

Referring to FIG. 5, the (k−1)th scan signal SCAN(k−1) applied to the (k−1)th scan line SLk−1 may be used to turn on and turn off the third transistor ST3. The kth scan signal SCANk applied to the kth scan line SLk may be used to turn on and turn off each of the first transistor ST1 and the second transistor ST2. The (k+1)th scan signal SCAN(k+1) applied to the (k+1)th scan line SLk+1 may be used to turn on and turn off the fourth transistor ST4. The kth emission signal EMk may be used to control the fifth transistor ST5 and the sixth transistor ST6.

The (k−1)th scan signal SCAN(k−1), the kth scan signal SCANk, the (k+1)th scan signal SCAN(k+1), and the kth emission signal EMk may be generated at every one frame period. One frame period may be divided into first to fourth periods t1 to t4. During the first period t1, the gate electrode of the driving transistor DT may be initialized. During the second period t2, the data voltage may be supplied to the gate electrode of the driving transistor DT, and the threshold voltage of the driving transistor DT may be sampled. During the third period t3, the anode electrode of the light-emitting element EL may be initialized. During the fourth period t4, the light-emitting element EL may emit light.

The (k−1)th scan signal SCAN(k−1), the kth scan signal SCANk and the (k+1)th scan signal SCAN(k+1) may be output sequentially during the first to third periods t1, t2 and t3 as a gate-on voltage Von. For example, the (k−1)th scan signal SCAN(k−1) may have a gate-on voltage Von during the first period t1 and may have a gate-off voltage Voff during the other periods. The kth scan signal SCANk may have the gate-on voltage Von during the second period t2 and may have the gate-off voltage Voff during the other periods. The (k+1)th scan signal SCAN(k+1) may have the gate-on voltage Von during the third period t3 and may have the gate-off voltage Voff during the other periods. Although the period in which the (k−1)th scan signal SCAN(k−1) has the gate-on voltage Von may be shorter than the first period t1 in the graph shown in FIG. 5, the period may be substantially equal to the first period t1. Although the period in which the kth scan signal SCANk has the gate-on voltage Von may be shorter than the second period t2 in the graph shown in FIG. 5, the period may be substantially equal to the second period t2. In addition, although the period in which the (k+1)th scan signal SCAN(k+1) may have the gate-on voltage Von may be shorter than the third period t3 in the graph shown in FIG. 5, the period may be substantially equal to the third period t3.

The kth emission signal EMk may have the gate-on voltage Von during the fourth period t4 and may have the gate-off voltage Voff during the other periods.

In the graph shown in FIG. 5, each of the first period t1, the second period t2 and the third period t3 may be one horizontal period. One horizontal period refers to a period during which a data voltage may be supplied to each of the sub pixels SP connected to a scan line of the display panel 10, and thus the one horizontal period may be defined as one horizontal line scan period. The data voltages may be supplied to the data lines DL in synchronization with the gate-on voltage Von of each of the scan signals.

The gate-on voltage Von may correspond to a turn-on voltage capable of turning on each of the first to sixth transistors ST1, ST2, ST3, ST4, ST5 and ST6. The gate-off voltage Voff may correspond to a turn-off voltage capable of turning off each of the first to sixth transistors ST1, ST2, ST3, ST4, ST5 and ST6.

FIGS. 6 to 9 illustrate schematic diagrams for explaining a method of driving an equivalent circuit of a first sub pixel during the first to fourth periods of FIG. 5.

Hereinafter, the operation of the sub pixel SP during the first to fourth periods t1 to t4 will be described in conjunction with FIGS. 5 to 9.

Figure 6:
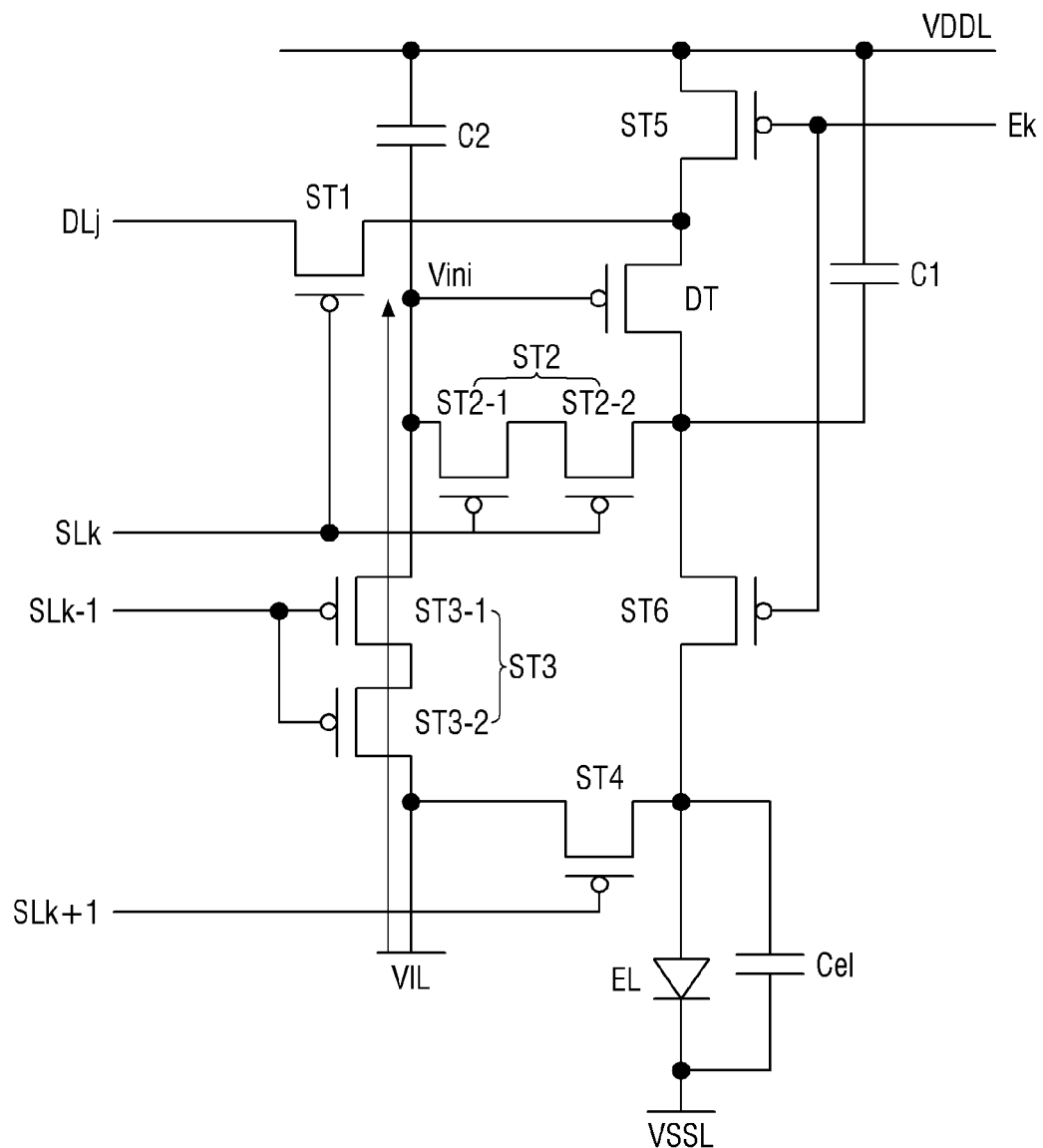
FIGS. 6 to 9 illustrate schematic diagrams for explaining a method of driving an equivalent circuit of a first sub pixel during the first to fourth periods of FIG. 5.

First, the (k−1)th scan signal SCAN(k−1) having the gate-on voltage Von may be supplied to the (k−1)th scan line SLk−1 during the first period t1. During the first period t1, the third transistor ST3 may be turned on by the (k−1)th scan signal SCAN(k−1) having the gate-on voltage Von, as shown in FIG. 6. As the third transistor ST3 may be turned on, the gate electrode of the driving transistor DT may be initialized to the initializing voltage Vini of the initializing voltage line VIL.

Figure 7:
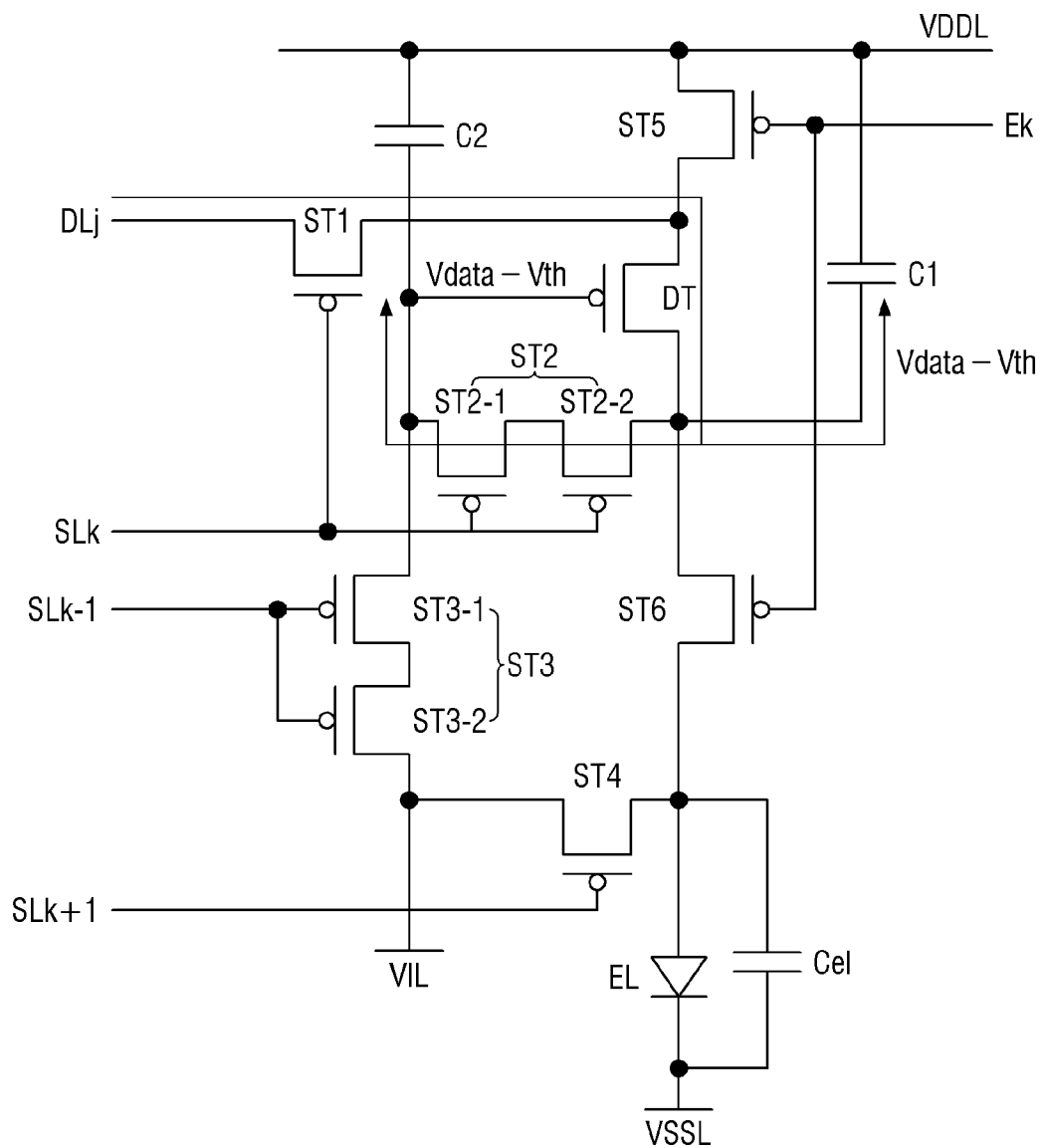

Second, the kth scan signal SCANk having the gate-on voltage Von may be supplied to the kth scan line SLk during the second period t2. During the second period t2, each of first transistor ST1 and the second transistor ST2 may be turned on by the kth scan signal SCANk having the gate-on voltage Von, as shown in FIG. 7.

In a case that the second transistor ST2 may be turned on, the gate electrode and the second electrode of the driving transistor DT may be connected to each other, such that the driving transistor DT may function as a diode. As the first transistor ST1 may be turned on, the data voltage Vdata may be supplied to the first electrode of the driving transistor DT. At this time, since the voltage difference between the gate electrode and the first electrode of the driving transistor DT (Vsg=Vdata−Vini) may be larger than the threshold voltage Vth, the driving transistor DT may form a current path until the voltage difference Vsg reaches the threshold voltage Vth. Accordingly, the gate electrode and the second electrode of the driving transistor DT may increase up to the voltage difference (Vdata−Vth) between the data voltage Vdata and the threshold voltage Vth of the driving transistor DT during the second period t2. The voltage equal to the voltage difference (Vdata−Vth) may be stored in each of the first capacitor C1 and the second capacitor C2.

Figure 8:
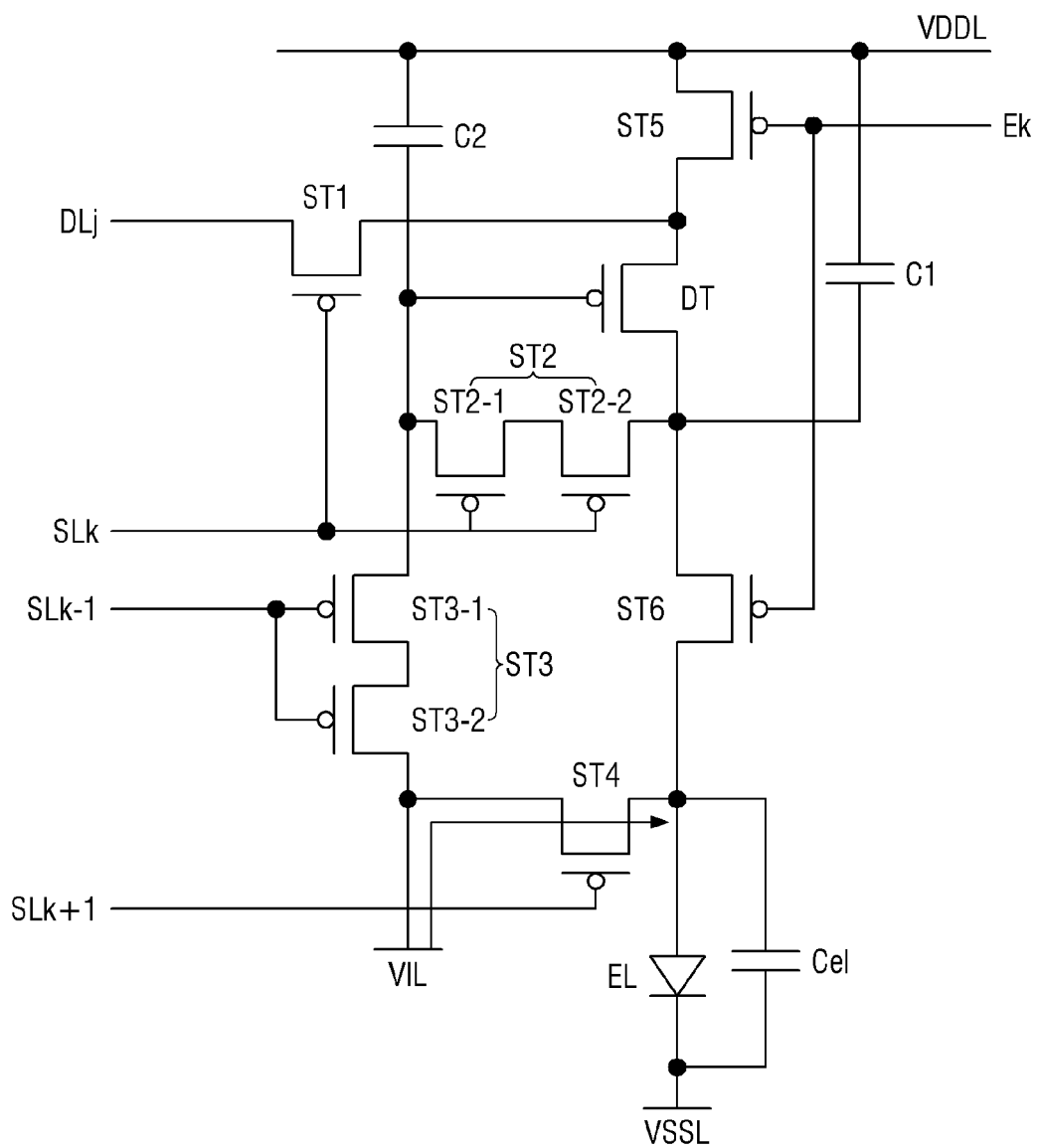

Third, the (k+1)th scan signal SCAN(k+1) having the gate-on voltage Von may be supplied to the (k+1)th scan line SLk+1 during the third period t3. During the third period t3, the fourth transistor ST4 may be turned on by the (k+1)th scan signal SCAN(k+1) having the gate-on voltage Von, as shown in FIG. 8. As the fourth transistor ST4 may be turned on, the anode electrode of the light-emitting element EL may be initialized to the initializing voltage Vini of the initializing voltage line VIL.

Figure 9:
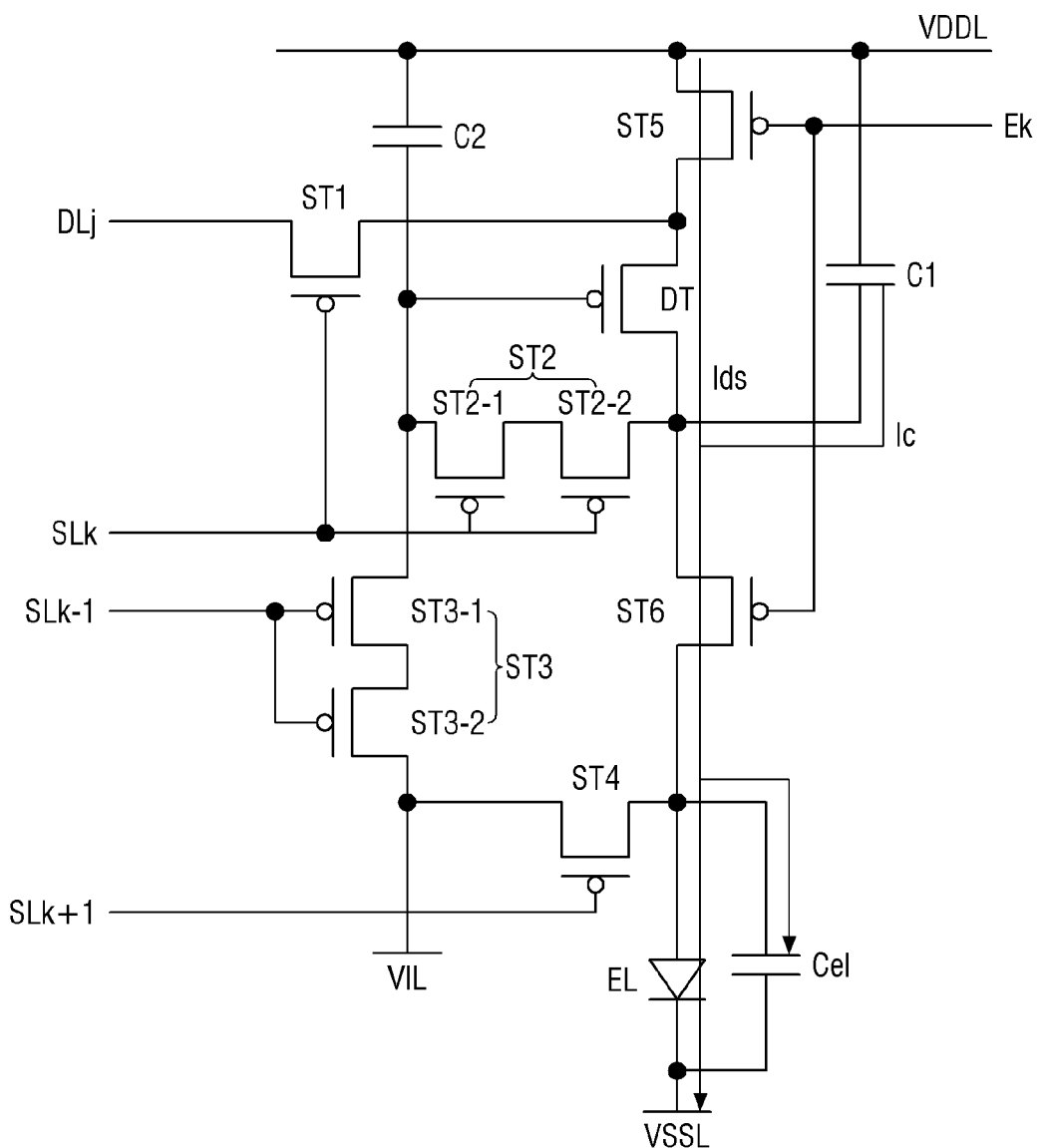

Fourth, the kth emission signal EMk having the gate-on voltage Von may be supplied to the kth emission line Ek during the fourth period t4. During the fourth period t4, each of fifth transistor ST5 and the sixth transistor ST6 may be turned on by the kth emission signal EMk having the gate-on voltage Von, as shown in FIG. 9.

In a case that the fifth transistor ST5 may be turned on, the first electrode of the driving transistor DT may be connected to the first supply voltage line VDDL. As the sixth transistor ST6 may be turned on, the second electrode of the driving transistor DT may be connected to the anode electrode of the light-emitting element EL.

In a case that the fifth transistor ST5 and the sixth transistor ST6 may be turned on, the driving current Ids flowing may be supplied to the light-emitting element EL according to the voltage at the gate electrode of the driving transistor DT. The driving current Ids may be defined as shown in Equation 2 below:

$$Ids = k' \times (ELVDD - (Vdata - Vth) - Vth)^2 \qquad \text{[Equation 2]}$$

where k' denotes a proportional coefficient determined by the structure and physical properties of the driving transistor, Vth denotes the threshold voltage of the driving transistor, and ELVVD denotes the first supply voltage from the first supply voltage line VDDL, and Vdata denotes the data voltage. The gate voltage of the driving transistor DT may be equal to Vdata−Vth, and the voltage at the first electrode may be equal to ELVDD. By summarizing Equation 2, Equation 3 below may be derived.

$$Ids = k' \times (ELVDD - Vdata)^2 \qquad \text{[Equation 3]}$$

Consequently, the driving current Ids may not depend on the threshold voltage Vth of the driving transistor DT as in Equation 3. That is, the threshold voltage Vth of the driving transistor DT may be compensated.

Figure 10:
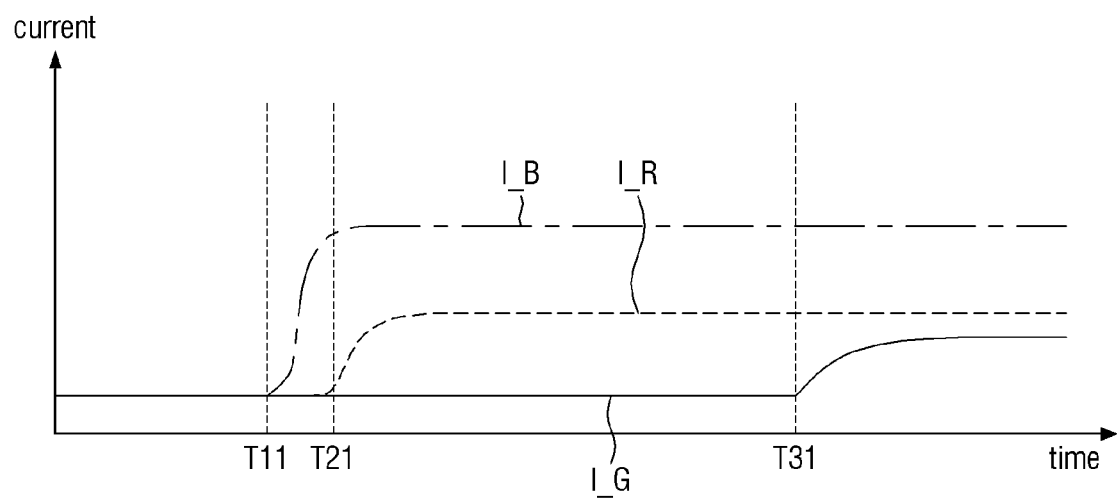
FIG. 10 illustrates a waveform diagram showing driving currents flowing in the light-emitting elements in the first to third sub pixels when the first to third sub pixels include the same first capacitors.

Incidentally, as shown in FIG. 9, the driving current Ids may be supplied not only to the light-emitting element EL but also to the parasitic capacitance Cel. However, in a case that the light-emitting element EL may emit light with a low luminance, the driving current Ids may be small, and thus it may take a long time to charge the parasitic capacitance Cel. In a case that it takes a long time to charge the parasitic capacitance Cel as shown in FIG. 10, emission of the light-emitting elements EL may be delayed in some of the sub pixels.

The sub pixels SP may include first sub pixels emitting light of a first color, second sub pixels emitting light of a second color, and third sub pixels emitting light of a third color. In the following description, for convenience of illustration, the first sub pixels are red sub pixels emitting red light, the second sub pixels are green sub pixels emitting green light, and the third sub pixels are blue sub pixels emitting blue light.

The first sub pixel, the second sub pixel and the third sub pixel may be defined as a single pixel for representing black-white/grayscale image. In some implementations, a single pixel may include a first sub pixel, two second sub pixels, and a third sub pixel.

In a case that a pixel represents black and then gray, the driving current Ids of the second sub pixel emitting green light may be smaller than the driving current Ids of the first sub pixel emitting red light. In addition, the driving current Ids of the second sub pixel emitting green light may be smaller than the driving current Ids of the third sub pixel emitting blue light. Furthermore, the parasitic capacitance Cel of the second sub pixel may be larger than the parasitic capacitance Cel of the first sub pixel and the parasitic capacitance Cel of the third sub pixel.

Accordingly, it may take a longer time in the second sub pixels to charge the parasitic capacitance Cel with the driving current Ids than in the first sub pixels to charge the parasitic capacitance Cel with the driving current Ids. In addition, it may take a longer time in the second sub pixels to charge the parasitic capacitance Cel with the driving current Ids than in the third sub pixels to charge the parasitic capacitance Cel with the driving current Ids. Therefore, as shown in FIG. 10, a time point T31 at which a driving current I_G starts to flow in the light-emitting element EL in the second sub pixel may be later than a time point T21 at which a driving current I_R starts to flow in the light-emitting element EL in the first sub pixel. In addition, the time point T31 at which the driving current I_G starts to flow in the light-emitting element EL in the second sub pixel may be later than a time point T11 at which a driving current I_B starts to flow in the light-emitting element EL in the third sub pixel.

Since the time point T31 at which the driving current I_G starts to flow in the light-emitting element EL in the second sub pixel may be later than that of each of the first and third sub pixels, the pixel may fail to represent gray and may represent another color. For example, a pixel may represent a purplish color due to lack of green.

Figure 11:
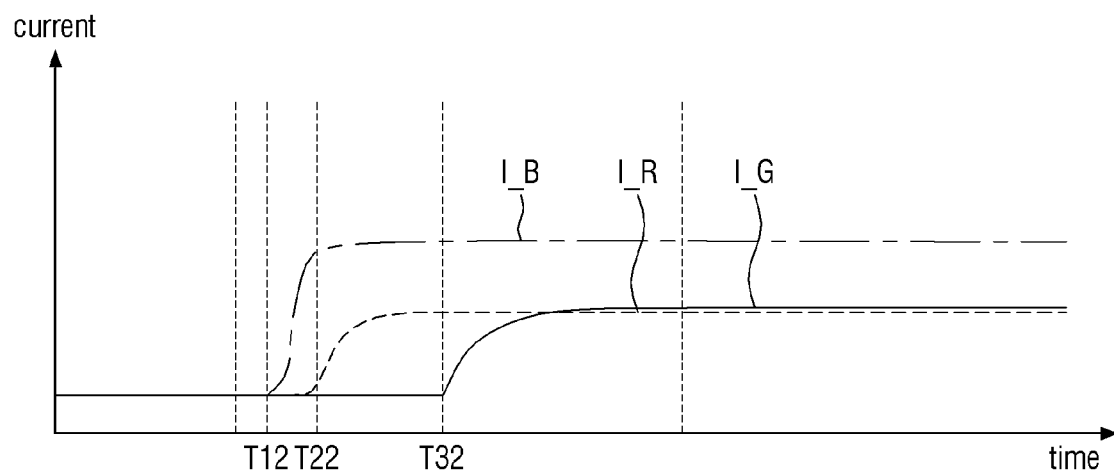
FIG. 11 illustrates a waveform diagram showing driving currents flowing in the light-emitting elements in the first to third sub pixels when the second sub pixel includes a first capacitor that is larger than a first capacitor of the first sub pixel and a first capacitor of the third sub pixel.

To overcome such a problem, as shown in FIG. 9, in a case that the fifth transistor ST5 and the sixth transistor ST6 may be turned on, a charging current Ic may further flow to the parasitic capacitance Cel by the voltage (Vdata+Vth) stored in the first capacitor C1. The capacitance of the first capacitor C1 of the second sub pixels, in which it takes a longer time to charge the parasitic capacitance Cel with the driving current Ids, may be larger than the capacitance of the first capacitor C1 of the first sub pixels and the capacitance of the first capacitor C1 of the third sub pixel. As a result, the charging current Ic flowing to the parasitic capacitance Cel in the second sub pixel may be larger than the charging current Ic flowing to the parasitic capacitance Cel in the first sub pixel and the charging current Ic flowing to the parasitic capacitance Cel in the third sub pixel. Thus, it may be possible to reduce the time taken to charge the parasitic capacitance Cel in the second sub pixel. As shown in FIG. 11, it may be possible to reduce the time difference between the time point T32 at which the driving current I_G starts to flow in the light-emitting element EL in the second sub pixel and the time point T22 at which the driving current I_R starts to flow in the light-emitting element EL in the first sub pixel. In addition, it may be possible to reduce the time difference between the time point T32 at which the driving current I_G starts to flow in the light-emitting element EL in the second sub pixel and the time point T12 at which the driving current I_B starts to flow in the light-emitting element EL in the third sub pixel. As a result, it may be possible to overcome the problem that a pixel fails to represent a desired color due to the time difference between the time points at which the driving current Ids starts to flow in the light-emitting elements EL among the different sub pixels.

Figure 12:
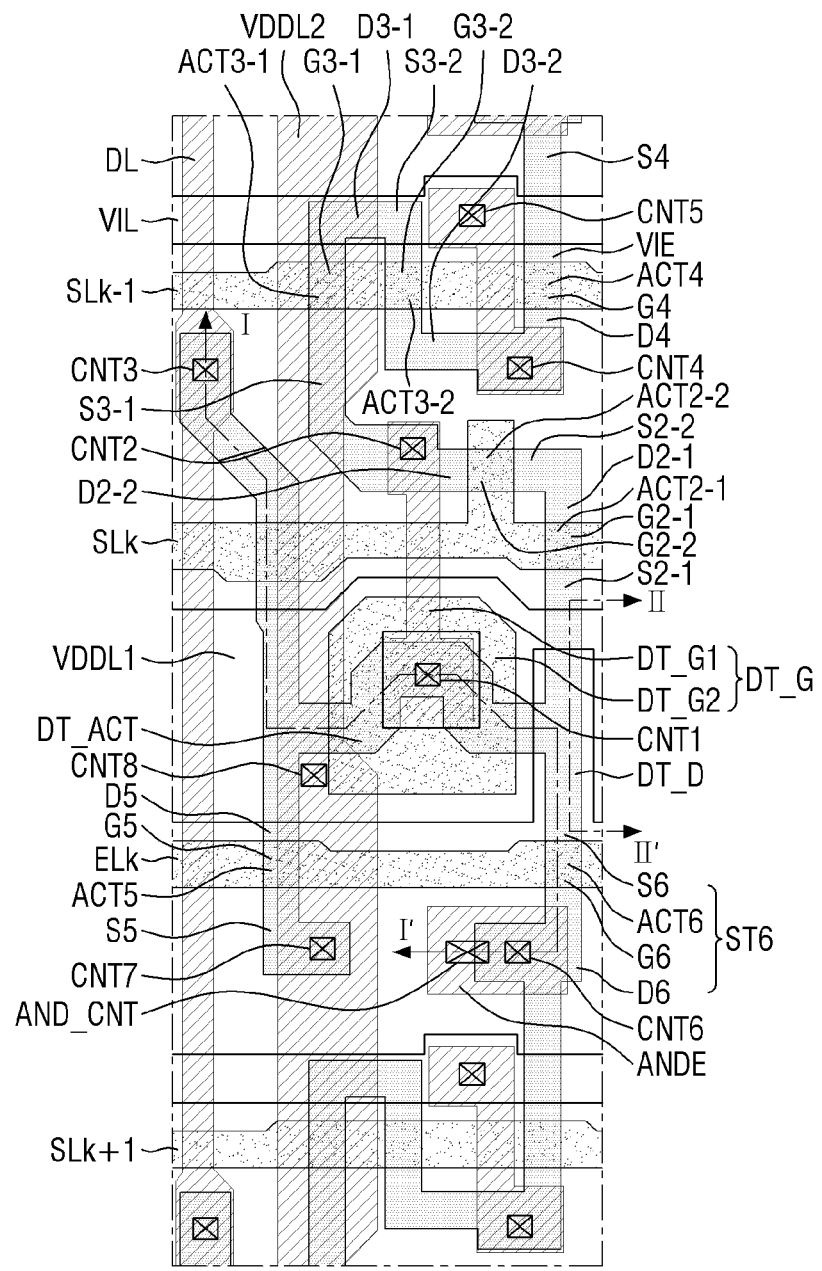
FIGS. 12 to 14 illustrate plan views showing first to third sub pixels according to an embodiment of the disclosure.
Figure 13:
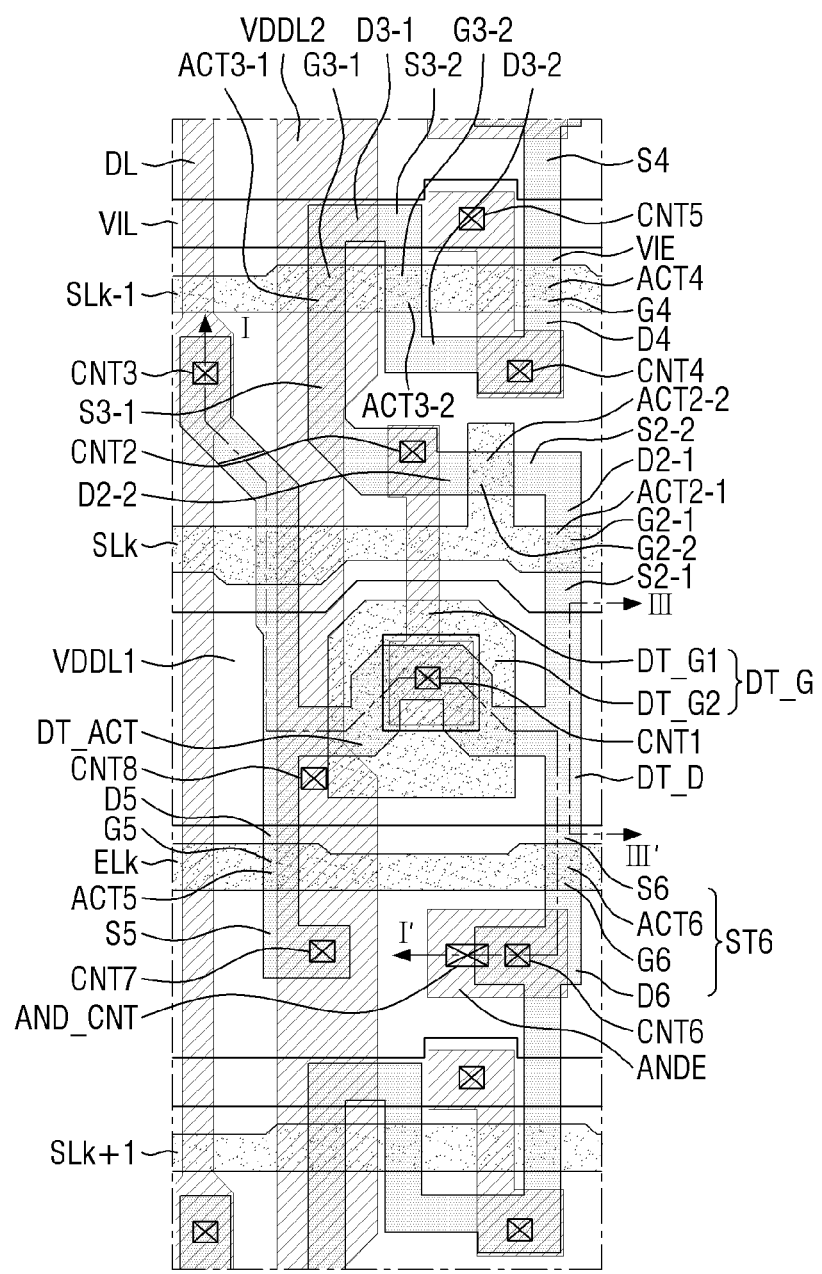
Figure 14:
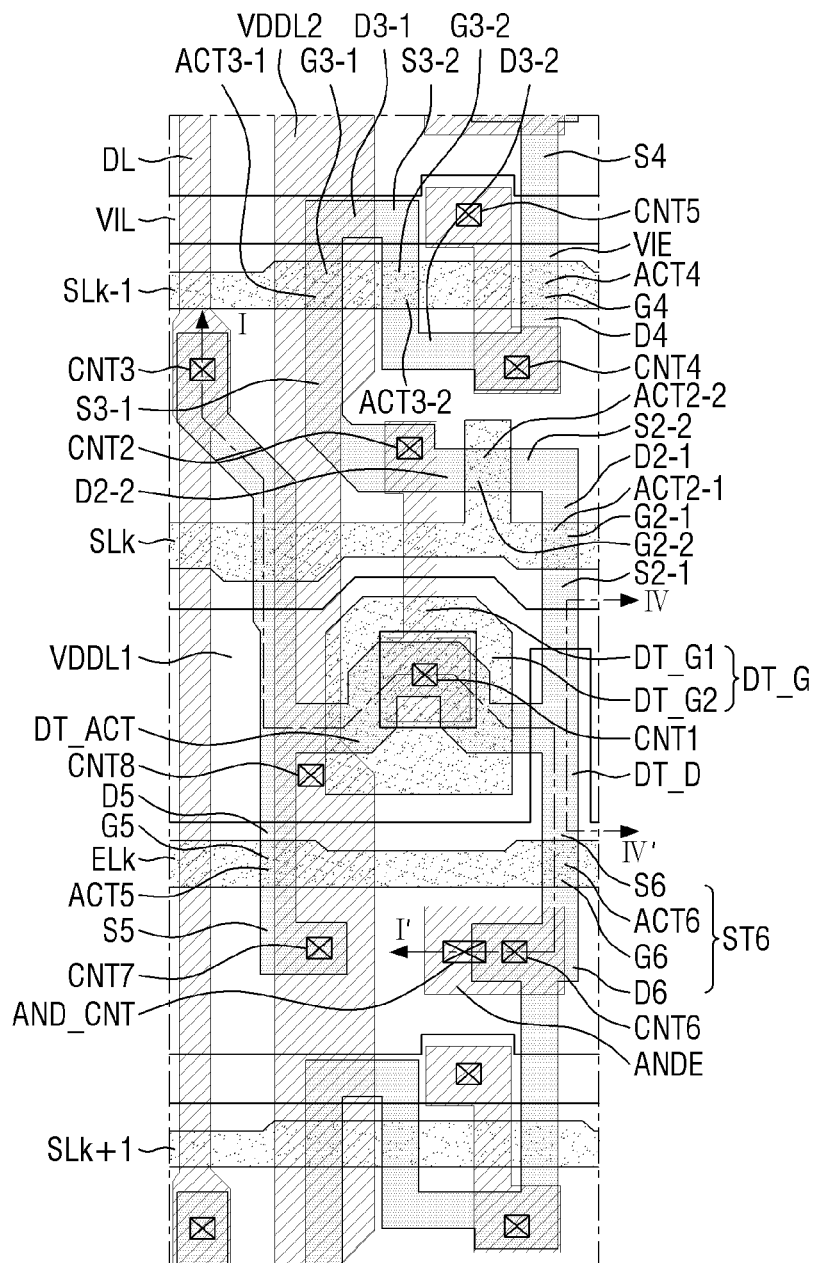

FIGS. 12 to 14 illustrate plan views showing first to third sub pixels according to an embodiment of the disclosure.

Referring to FIGS. 12 to 14, each of the first sub pixel SP1, the second sub pixel SP2 and the third sub pixel SP3 may include a driving transistor DT, first to sixth transistors ST1 to ST6, a first capacitor C1, and a second capacitor C2.

The driving transistor DT may include an active layer DT_ACT, a gate electrode DT_G, a first electrode DT_S, and a second electrode DT_D. The active layer DT_ACT of the driving transistor DT may overlap the gate electrode DT_G of the driving transistor DT. The gate electrode DT_G of the driving transistor DT may include a first gate electrode DT_G1 and a second gate electrode DT_G2. The second gate electrode DT_G2 may be disposed on the first gate electrode DT_G1, and the first gate electrode DT_G1 and the second gate electrode DT_G2 may be connected to each other through a first contact hole CNT1. The first gate electrode DT_G1 may overlap with the active layer DT_ACT of the driving transistor DT, and the second driving gate electrode DT_G2 may be connected to a second electrode D2-1 of a (2-1)th transistor ST2-1 through a second contact hole CNT2. The first electrode DT_S of the driving transistor DT may be connected to the first electrode S1 of the first transistor ST1. The second electrode DT_D of the driving transistor DT may be connected to the first electrode S2-1 of the (2-2)th transistor ST2-2 and the first electrode S6 of the sixth transistor ST6.

The first transistor ST1 may include an active layer ACT1, a gate electrode G1, a first electrode S1, and a second electrode D1. The gate electrode G1 of the first transistor ST1 may be a part of the kth scan line SLk, where k may be a positive integer equal to or greater than two. The gate electrode G1 may be the part of the kth scan line SLk that overlaps with the active layer ACT1 of the first transistor ST1. The first electrode S1 of the first transistor ST1 may be connected to the first electrode DT_S of the driving transistor DT. The second electrode D1 of the first transistor ST1 may be connected to the jth data line DLj through a third contact hole CNT3.

The second transistor ST2 may be implemented as a dual transistor. The second transistor ST2 may include a (2-1)th transistor ST2-1 and a (2-2)th transistor ST2-2.

The (2-1)th transistor ST2-1 may include an active layer ACT2-1, a gate electrode G2-1, a first electrode S2-1, and a second electrode D2-1. The gate electrode G2-1 of the (2-1)th transistor ST2-1 may be a part of the kth scan line SLk. The gate electrode G2-1 may be the part of the kth scan line SLk that overlaps with the active layer ACT2-1 of the (2-1)th transistor ST2-1. The first electrode S2-1 of the (2-1)th transistor ST2-1 may be connected to the second electrode S2-2 of the (2-2)th transistor ST2-2. The second electrode D2-1 of the (2-1)th transistor ST2-1 may be connected to the second gate electrode DT_G2 of the driving transistor DT through the second contact hole CNT2.

The (2-2)th transistor ST2-2 may include an active layer ACT2-2, a gate electrode G2-2, a first electrode S2-2, and a second electrode D2-2. The gate electrode G2 of the (2-2)th transistor ST2-2 may be a part of the kth scan line SLk. The gate electrode G2 may be the part of the kth scan line SLk that overlaps with the active layer ACT2-2 of the (2-2)th transistor ST2-2. The first electrode S2-2 of the (2-2)transistor ST2-2 may be connected to the second electrode DT_D of the driving transistor DT. The second electrode D2-2 of the (2-2)th transistor ST2-2 may be connected to the first electrode S2-1 of the (2-1)th transistor ST2-1.

The third transistor ST3 may be implemented as a dual transistor. The third transistor ST3 may include a (3-1)th transistor ST3-1 and a (3-2)th transistor ST3-2.

The (3-1)th transistor ST3-1 may include an active layer ACT3-1, a gate electrode G3-1, a first electrode S3-1, and a second electrode D3-1. The gate electrode G3-1 of the (3-1)th transistor ST3-1 may be a part of the (k−1)th scan line SLk−1. The gate electrode G3-1 may be the part of the (k−1)th scan line SLk−1 that overlaps with the active layer ACT3-1 of the (3-1)th transistor ST3-1. The first electrode S3-1 of the (3-1)th transistor ST3-1 may be connected to the second gate electrode DT_G2 of the driving transistor DT through the second contact hole CNT2. The second electrode D3-1 of the (3-1)th transistor ST3-1 may be connected to the first electrode S3-2 of the (3-2)th transistor ST3-2.

The (3-2)th transistor ST3-2 may include an active layer ACT3-2, a gate electrode G3-2, a first electrode S3-2, and a second electrode D3-2. The gate electrode G3-2 of the (3-2)th transistor ST3-2 may be a part of the (k−1)th scan line SLk−1. The gate electrode G3-2 may be the part of the (k−1)th scan line SLk−1 that overlaps with the active layer ACT3-2 of the (3-2)th transistor ST3-2. The first electrode S3-2 of the (3-2)th transistor ST3-2 may be connected to the second gate electrode DT_G2 of the driving transistor DT through the second contact hole CNT2. The second electrode D3 of the (3-2)th transistor ST3-2 may be connected to an initializing connection electrode VIE through a fourth contact hole CNT4.

The fourth transistor ST4 may include an active layer ACT4, a gate electrode G4, a first electrode S4, and a second electrode D4. The gate electrode G4 of the fourth transistor ST4 may be a part of the (k+1)th scan line SLk+1. The gate electrode G4 may be the part of the (k+1)th scan line SLk+1 that overlaps with the active layer ACT4 of the fourth transistor ST4. The first electrode S4 of the fourth transistor ST3 may be connected to the anode connection electrode ANDE through a sixth contact hole CNT6. The anode electrode AND of the light-emitting element may be connected to the anode connection electrode ANDE through an anode contact hole AND_CNT. The second electrode D4 of the fourth transistor ST4 may be connected to the initializing connection electrode VIE through the fourth contact hole CNT4. The initializing voltage line VIL may be connected to the initializing connection electrode VIE through the fifth contact hole CNT5. The initializing connection electrode VIE may be connected to the second electrode D3-2 of the (3-2)th transistor ST3-2 and the second electrode D4 of the fourth transistor ST4 through the fourth contact hole CNT4. The initializing connection electrode VIE may be disposed such that it intersects the (k−1)th scan line SLk−1.

The fifth transistor ST5 may include an active layer ACT5, a gate electrode G5, a first electrode S5, and a second electrode D5. The gate electrode G5 of the fifth transistor ST5 may be a part of a kth emission control line ELk. The gate electrode G5 may be the part of the kth emission control line ELk that overlaps with the active layer ACT5 of the fifth transistor ST5. The first electrode S5 of the fifth transistor ST5 may be connected to a second sub supply voltage line VDDL2 through a seventh contact hole CNT7. The second electrode D5 of the fifth transistor ST5 may be connected to the first electrode DT_S of the driving transistor DT.

The sixth transistor ST6 may include an active layer ACT6, a gate electrode G6, a first electrode S6, and a second electrode D6. The gate electrode G6 of the sixth transistor ST6 may be a part of the kth emission control line ELk. The gate electrode G6 may be the part of the kth emission control line ELk that overlaps with the active layer ACT6 of the sixth transistor ST6. The first electrode S6 of the sixth transistor ST6 may be connected to the second electrode DT_D of the driving transistor DT. The second electrode D6 of the sixth transistor ST6 may be connected to the anode electrode AND of the light-emitting element through the sixth contact hole CNT6.

Figure 15:
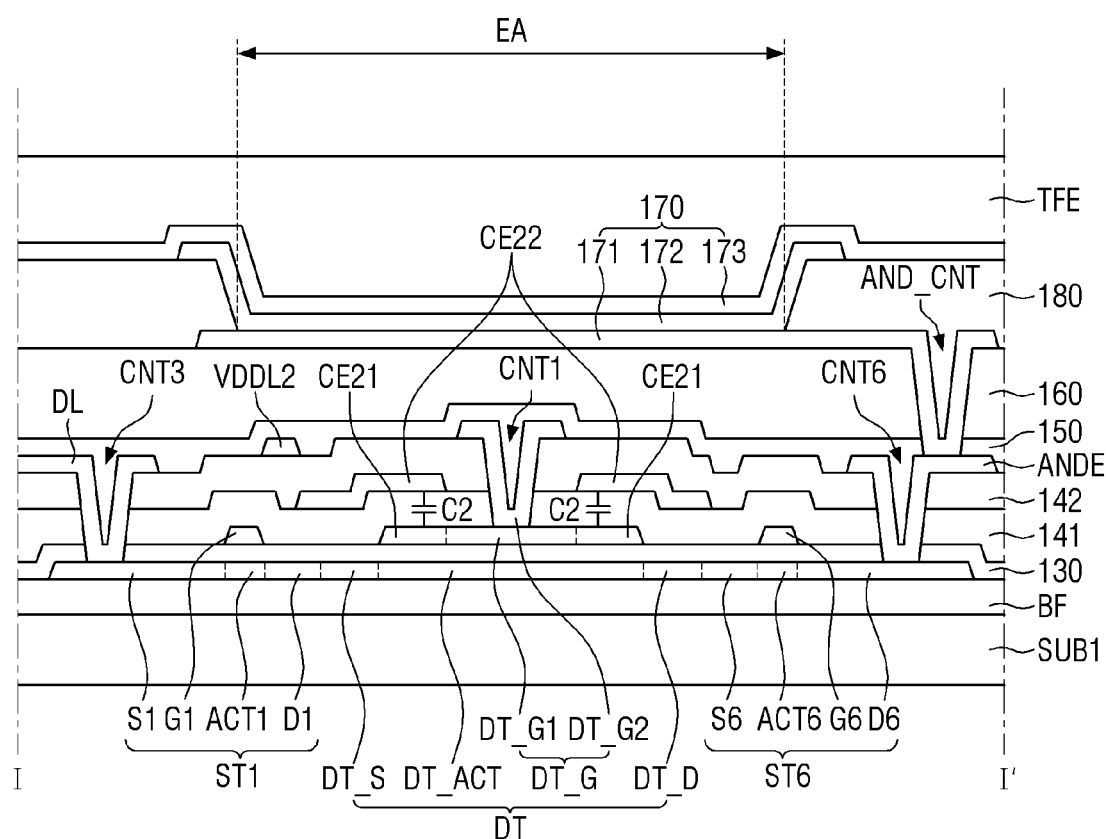
FIG. 15 illustrates a schematic cross-sectional view taken along line I-I' of FIG. 12.
Figure 16:
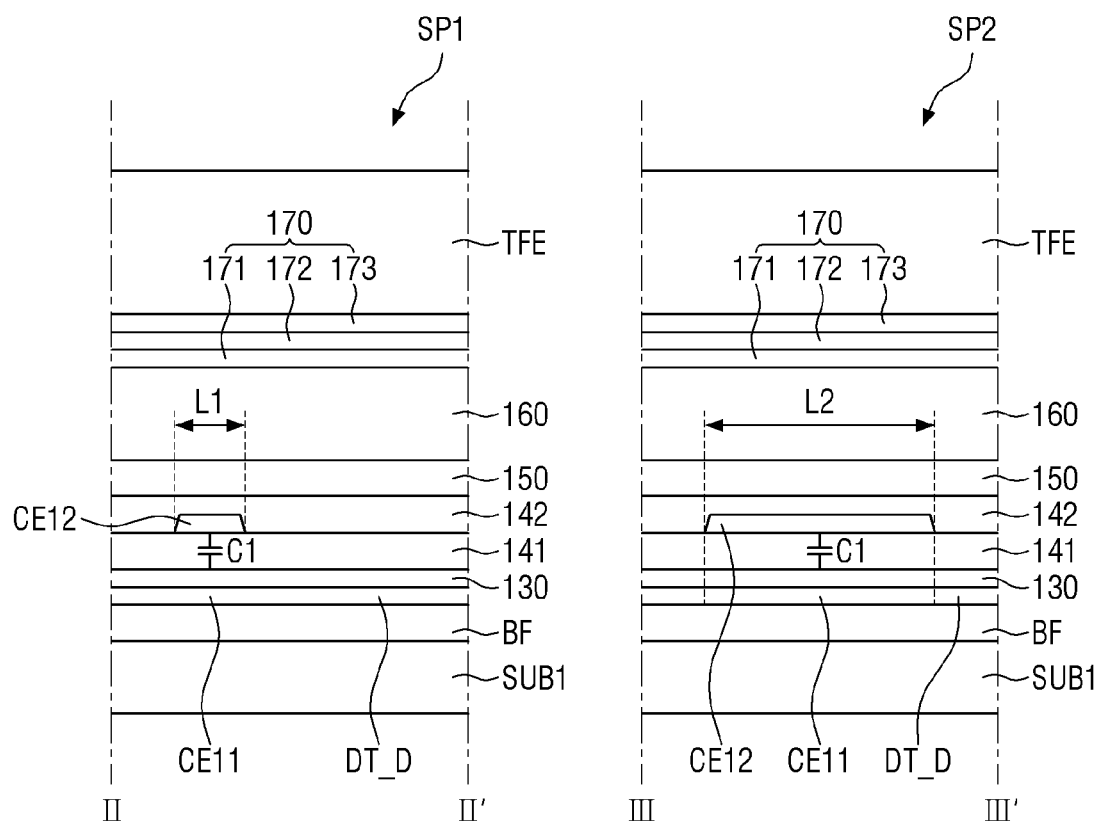
FIG. 16 illustrates schematic cross-sectional views taken along lines II-II' of FIG. 12 and III-III' of FIG. 13.

When also referring to FIGS. 15-16, the first electrode CE11 of the first capacitor C1 may be a part of the second electrode DT_D of the driving transistor DT, and the second electrode CE12 of the first capacitor C1 may be a first sub supply voltage line VDDL1 that overlaps with the second electrode DT_D of the driving transistor DT. The first sub supply voltage line VDDL1 may be connected to the first sub supply voltage line VDDL1 through an eighth contact hole CNT8. The second sub supply voltage line VDDL2 may be disposed in parallel with the jth data line DLj, and the first sub supply voltage line VDDL1 may be disposed in parallel with the kth scan line SLk.

The first electrode CE21 of the second capacitor C2 may be substantially identical to the first gate electrode DT_G1 of the driving transistor DT. The second electrode CE22 of the second capacitor C2 may be the first sub supply voltage line VDDL1 that overlaps with the gate electrode DT_G of the driving transistor DT.

The area of the second capacitor C2 may be larger than the area of the first capacitor C1. That is, since the second capacitor C2 holds the voltage at the gate electrode of the driving transistor DT for one frame period, the capacitance of the second capacitor C2 may be larger than the capacitance of the first capacitor C1.

The capacitance of the first capacitor C1 may be proportional to the area where the second electrode DT_D of the driving transistor DT overlaps with the (1-1) driving voltage line VDDL1. In other words, the capacitance of the first capacitor C1 may be increased proportionately as the area where the second electrode DT_D of the driving transistor DT overlaps with the (1-1) driving voltage line VDDL1 increases. The same proportional increase in capacitance may apply as the area where the second electrode DT_D of the driving transistor DT faces the (1-1) driving voltage line VDDL1. As such, the capacitance of the first capacitor C1 may be selectively determined to correspond to an amount of the overlap between second electrode DT_D of the driving transistor DT and the (1-1) driving voltage line, and particularly the second electrode CE12 of the first capacitor C1 that may be the first sub supply voltage line VDDL1.

As shown in FIGS. 12 and 13, the area where the second electrode DT_D of the driving transistor DT overlaps with the first sub supply voltage line VDDL1 in the second sub pixel SP2 may be larger than the area where the second electrode DT_D of the driving transistor DT overlaps with the first sub supply voltage line VDDL1 in the first sub pixel SP1. In addition, as shown in FIGS. 13 and 14, the area where the second electrode DT_D of the driving transistor DT overlaps with the first sub supply voltage line VDDL1 in the second sub pixel SP2 may be larger than the area where the second electrode DT_D of the driving transistor DT overlaps with the (3-1) supply voltage line VDDL1 in the third sub pixel SP3. In addition, the area where the second electrode DT_D of the driving transistor DT overlaps with the first sub supply voltage line VDDL1 in the first sub pixel SP1 may be substantially identical to the area where the second electrode DT_D of the driving transistor DT overlaps with the first sub supply voltage line VDDL1 in the third sub pixel SP3. Therefore, the capacitance of the first capacitor C1 of the second sub pixel SP2 may be larger than the capacitance of the first capacitor C1 of the first sub pixel SP1 and the capacitance of the first capacitor C1 of the third sub pixel SP3. The capacitances of the first capacitors C1 of the first sub pixel PX1 and the third sub pixel PX3 may be equal to each other.

According to an embodiment shown in FIGS. 12 to 14, the capacitance of the first capacitor C1 of the second sub pixels, in which it takes a longer time to charge the parasitic capacitance Cel with the driving current Ids, may be larger than the capacitance of the first capacitor C1 of the first sub pixels and the capacitance of the first capacitor C1 of the third sub pixel. Thus, the charging current Ic flowing to the parasitic capacitance Cel in the second sub pixel may be larger than the charging current Ic flowing to the parasitic capacitance Cel in the first sub pixel and the charging current Ic flowing to the parasitic capacitance Cel in the third sub pixel. It may be possible to reduce the time taken to charge the parasitic capacitance Cel in the second sub pixel. Therefore, it may possible to overcome the failure of a pixel to represent a desired color due to the difference between the time points at which the driving current Ids starts flowing in the light-emitting element EL among the sub pixels. Accordingly, it may be possible to prevent or suppress a deterioration of the quality of the image viewed by the user.

FIG. 15 illustrates a cross-sectional view taken along line I-I' of FIG. 12. FIG. 16 illustrates cross-sectional views taken along lines II-II' of FIG. 12 and III-III' of FIG. 13.

The cross-sectional view taken along line IV-IV' of FIG. 14 may be substantially identical to the cross-sectional view shown in FIG. 16 that is taken along line II-II' of FIG. 12; and, therefore, the cross-sectional view taken along line IV-IV' of FIG. 14 is not shown.

Referring to FIGS. 15 and 16, a thin-film transistor TFTL, a light-emitting element layer EML, and an encapsulation layer TFE may be sequentially formed on a first substrate SUB1.

The thin-film transistor TFTL may include a buffer film BF, an active layer ACT, a first gate layer GTL1, a second gate layer GTL2, a data metal layer DTL, a gate insulating layer 130, a first interlayer dielectric layer 141, a second interlayer dielectric layer 142, a protective layer 150, and a planarization layer 160.

The buffer film BF may be formed on a surface of the first substrate SUB1. The buffer film BF may be formed on the surface of the first substrate SUB1 in order to protect the thin-film transistors 120 and an organic emitting layer 172 of the light-emitting element layer EML from moisture that is likely to permeate through the first substrate SUB1. The buffer layer BF may be formed of inorganic layers stacked on one another alternately. For example, the buffer layer BF may be made up of multiple layers in which one or more inorganic layers of a silicon nitride layer, a silicon oxynitride layer, a silicon oxide layer, a titanium oxide layer and an aluminum oxide layer are alternately stacked on one another. The buffer layer BF may be eliminated.

The active layer ACT may be formed on the first substrate SUB1 or the buffer film BF. The active layer ACT may include polycrystalline silicon, single crystal silicon, low-temperature polycrystalline silicon, amorphous silicon, or an oxide semiconductor. As shown in FIG. 23, a light-blocking layer BSM for blocking external light incident on the active layer ACT may be formed under the active layer ACT.

In a case that the active layer ACT may be made of polycrystalline silicon by doping ions into the active layer ACT, the active layer ACT can have conductivity. Accordingly, the active layer ACT may include not only the active layers DT_ACT and ACT1 to ACT6 of the driving transistor DT and the first to sixth switching transistors ST1 to ST6 but also the source electrodes DT_S, S1, S2-1, S2-2, S3-1, S3-2, S4, S5 and S6 and the drain electrodes DT_D, D1, D2-1, D2-2, D3-1, D3-2, D4, D5 and D6.

The gate insulating layer 130 may be formed on the active layer ACT. The gate insulating layer 130 may be formed of an inorganic layer, for example, a silicon nitride layer, a silicon oxynitride layer, a silicon oxide layer, a titanium oxide layer, or an aluminum oxide layer.

A first gate layer GTL1 may be formed on the gate insulating layer 130. The first gate layer GTL1 may include not only the gate electrodes DT_G1 and G1 to G6 of the driving transistor DT and the first to sixth switching transistors ST1 to ST6 but also the scan lines SLk−1, SLk and SLk+1 and the emission control line Ek. The first gate layer GTL1 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The interlayer dielectric layer 141 may be formed over the first gate layer GTL1. The first interlayer dielectric layer 141 may be formed of an inorganic layer, for example, a silicon nitride layer, a silicon oxynitride layer, a silicon oxide layer, a titanium oxide layer, or an aluminum oxide layer. The first interlayer dielectric layer 141 may include a number of inorganic layers.

The second gate line GTL2 may be formed on the first interlayer dielectric layer 141. The second gate layer GTL2 may include an initializing voltage line VIL and a first sub supply voltage line VDDL1. The second gate layer GTL2 may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The second interlayer dielectric layer 142 may be formed over the second gate layer GTL2. The second interlayer dielectric layer 142 may be formed of an inorganic layer, for example, a silicon nitride layer, a silicon oxynitride layer, a silicon oxide layer, a titanium oxide layer, or an aluminum oxide layer. The second interlayer dielectric layer 142 may include a number of inorganic layers.

The data metal layer DTL may be formed on the second interlayer dielectric layer 142. The data metal layer DTL may include the data lines DL, the first supply voltage lines VDDL1, the second gate electrode DT_G2 of the driving transistor DT, the anode connection electrode ANDE, and the initializing connection electrode VIE. The data gate electrode DTL may be made up of a single layer or multiple layers of one of molybdenum (Mo), aluminum (Al), chromium (Cr), gold (Au), titanium (Ti), nickel (Ni), neodymium (Nd) and copper (Cu) or an alloy thereof.

The planarization layer 160 may be formed on the data metal layer DTL to provide a flat surface over the level differences of the active layer ACT, the first gate layer GTL1, the second gate layer GTL2, and the data metal layer DTL. The planarization layer 160 may be formed of an organic layer such as an acryl resin, an epoxy resin, a phenolic resin, a polyamide resin and a polyimide resin.

The protective layer 150 may be further formed between the data metal layer DTL and the planarization layer 160. The protective layer 150 may be formed of an inorganic layer, for example, a silicon nitride layer, a silicon oxynitride layer, a silicon oxide layer, a titanium oxide layer, or an aluminum oxide layer.

Although the driving transistor DT and the first to sixth transistors ST1 to ST6 are implemented as top-gate transistors in which the gate electrode is located above the active layer in the example shown in FIG. 8, the disclosure may not be limited thereto. That is, the driving transistor DT and the first to sixth transistors ST1 to ST6 may be implemented as bottom-gate transistors in which the gate electrode may be disposed below the active layer 121, or as double-gate transistors in which the gate electrodes may be disposed above and below the active layer.

The first contact hole CNT1 may be a hole that penetrates the first interlayer dielectric layer 141 and the second interlayer dielectric layer 142, via which the first gate electrode DT_G1 of the driving transistor DT is exposed as shown in FIG. 15. The second gate electrode DT_G2 of the driving transistor DT may be connected to the first gate electrode DT_G1 of the driving transistor DT through the first contact hole CNT1.

The second contact hole CNT2 may be formed through the gate insulating layer 130, the first interlayer dielectric layer 141 and the second interlayer dielectric layer 142, via which the second electrode D2-1 of the (2-1)th transistor ST2-1 is exposed. The second gate electrode DT-G2 of the driving transistor DT may be connected to the second electrode D2-1 of the (2-1)th transistor ST2-1 through the second contact hole CNT2.

The third contact hole CNT3 may be formed through the gate insulating layer 130, the first interlayer dielectric layer 141 and the second interlayer dielectric layer 142, via which the first electrode S1 of the first transistor ST1 may be exposed. The jth data line DLj may be connected to the first electrode S1 of the first transistor ST1 through the third contact hole CNT3.

The fourth contact hole CNT4 may be formed through the gate insulating layer 130, the first interlayer dielectric layer 141 and the second interlayer dielectric layer 142, via which the second electrode D3 of the third transistor ST3 and the second electrode D3 of the fourth transistor ST4 may be exposed. The initializing connection electrode VIE may be connected to the second electrode D3 of the third transistor ST3 and the second electrode D3 of the fourth transistor ST4 through the fourth contact hole CNT4.

The fifth contact hole CNT5 may be formed through the second interlayer dielectric layer 142, via which the initializing voltage line VIL may be exposed. The initializing connection electrode VIE may be connected to the initializing voltage line VIL through the fifth contact hole CNT5.

The sixth contact hole CNT6 may be formed through the gate insulating layer 130, the first interlayer dielectric layer 141 and the second interlayer dielectric layer 142, via which the second electrode D6 of the sixth transistor ST6 may be exposed. The anode connection electrode ANDE may be connected to the second electrode D6 of the sixth transistor ST6 through the sixth contact hole CNT6.

The seventh contact hole CNT7 may be formed through the gate insulating layer 130, the first interlayer dielectric layer 141 and the second interlayer dielectric layer 142, via which the first electrode S5 of the fifth transistor ST5 is exposed. The second sub supply voltage line VDDL2 may be connected to the first electrode S5 of the fifth transistor ST5 through the seventh contact hole CNT7.

The eighth contact hole CNT8 may be formed through the second interlayer dielectric layer 142, via which the first sub supply voltage line VDDL1 may be exposed. The second sub supply voltage line VDDL2 may be connected to the first sub supply voltage line VDDL1 through the eighth contact hole CNT8.

The anode contact hole AND_CNT may be formed through the protective layer 150 and the planarization layer 160, via which the anode connection electrode ANDE may be exposed.

The light-emitting element layer EML may be formed on the thin-film transistor layer TFTL. The light-emitting element layer EML may include light-emitting elements 170 and a bank layer 180.

The light-emitting elements 170 and the bank layer 180 may be formed on the planarization layer 160. Each of the light-emitting elements 170 may include a first electrode 171, an organic emitting layer 172, and a second electrode 173.

The first electrode 171 may be formed on the planarization layer 160. The first electrode 171 may be connected to the anode connection electrode ANDE through the anode contact hole AND_CNT penetrating through the protective layer 150 and the planarization layer 160.

In a top-emission organic light-emitting diode that light exits from the organic emitting layer 172 toward the second electrode 173, the first electrode 171 may be made of a metal material having a high reflectivity such as a stack structure of aluminum and titanium (Ti/Al/Ti), a stack structure of aluminum and ITO (ITO/Al/ITO), an APC alloy and a stack structure of APC alloy and ITO (ITO/APC/ITO). The APC alloy may be an alloy of silver (Ag), palladium (Pd) and copper (Cu).

The bank layer 180 may be formed on the planarization layer 250 to partition the first electrode 171 in order to define the emission area of each of the sub pixels SP1, SP2 and SP3. The bank layer 180 may be formed to cover the edge of the first electrode 171. The bank layer 180 may be formed of an organic layer such as an acryl resin, an epoxy resin, a phenolic resin, a polyamide resin and a polyimide resin.

In the emission area EA of each of the sub pixels SP1, SP2 and SP3, the first electrode 171, the organic emitting layer 172 and the second electrode 173 may be stacked on one another in this order, so that holes from the first electrode 171 and electrons from the second electrode 173 may be combined with each other in the organic emitting layer 172 to emit light.

The organic emitting layer 172 may be formed on the first electrode 171 and the bank layer 180. The organic emitting layer 172 may include an organic material and emit light of a certain color. For example, the organic emitting layer 172 may include a hole transporting layer, an organic material layer, and an electron transporting layer. The organic emitting layer 172 of the first sub pixel SP1 may emit light of a first color, the organic emitting layer 172 of the second sub pixel SP2 may emit light of a second color, and the organic emitting layer 172 of the third sub pixel SP3 may emit light of a third color. As another example, the organic emitting layers 172 of the sub pixels SP1, SP2 and SP3 may emit white light. In such a case, the first sub pixel SP1 may overlap with the color filter layer of the first color, the second sub pixel SP2 may overlap with the color filter layer of the second color, and the third sub pixel SP3 may overlap with the color filter layer of the third color. Herein, the first color may be red, the second color may be green, and the third color may be blue.

The second electrode 173 may be formed on the organic emitting layer 172. The second electrode 173 may be formed to cover the organic emitting layer 172. The second electrode 173 may be a common layer formed across the sub pixels SP1, SP2 and SP3. A capping layer may be formed on the second electrode 173.

In the top-emission organic light-emitting diode, the second electrode 173 may be formed of a transparent conductive material (TCP) such as ITO and IZO that can transmit light, or a semi-transmissive conductive material such as magnesium (Mg), silver (Ag) and an alloy of magnesium (Mg) and silver (Ag). In a case that the second electrode 173 may be formed of a transflective metal material, the light extraction efficiency can be increased by using microcavities.

The encapsulation layer TFE may be formed on the light-emitting element layer EML, for example. The encapsulation layer TFE may include at least one inorganic layer to prevent permeation of oxygen or moisture into the light-emitting element layer EML. In addition, the encapsulation layer TFE may include at least one organic layer to protect the light-emitting element layer EML from foreign substances such as dust.

As another example, a second substrate may be disposed on the light-emitting element layer EML instead of the encapsulation layer TFE, such that the space between the light-emitting element layer EML and the second substrate may be empty or filled with a filling film. The filling film may be an epoxy filling film or a silicon filling film.

As shown in FIGS. 15 and 16, the length L2 of the first sub supply voltage line VDDL1 in a direction that overlaps with the second electrode DT_D of the driving transistor DT in the second sub pixel SP2 may be larger than the length L1 of the first sub supply voltage line VDDL1 that overlaps with the second electrode DT_D of the driving transistor DT in the first sub pixel SP1. The length of the first sub supply voltage line VDDL1 that overlaps with the second electrode DT_D of the driving transistor DT in the third sub pixel SP3 may be substantially identical to the length L1 of the first sub supply voltage line VDDL1 that overlaps with the second electrode DT_D of the driving transistor DT in the first sub pixel SP1.

Accordingly, the area where the second electrode DT_D of the driving transistor DT overlaps with the first sub supply voltage line VDDL1 in the second sub pixel SP2 may be larger than the area where the second electrode DT_D of the driving transistor DT overlaps with the first sub supply voltage line VDDL1 in the first sub pixel SP1. In addition, the area where the second electrode DT_D of the driving transistor DT overlaps with the first sub supply voltage line VDDL1 in the first sub pixel SP1 may be substantially identical to the area where the second electrode DT_D of the driving transistor DT overlaps with the first sub supply voltage line VDDL1 in the third sub pixel SP3. Therefore, the capacitance of the first capacitor C1 of the second sub pixel SP2 may be larger than the capacitance of the first capacitor C1 of the first sub pixel SP1 and the capacitance of the first capacitor C1 of the third sub pixel SP3. The capacitances of the first capacitors C1 of the first sub pixel PX1 and the third sub pixel PX3 may be equal to each other.

According to an embodiment shown in FIGS. 15 and 16, the capacitance of the first capacitor C1 of the second sub pixel, in which it takes a longer time to charge the parasitic capacitance Cel with the driving current Ids, may be larger than the capacitance of the first capacitor C1 of the first sub pixel and the capacitance of the first capacitor C1 of the third sub pixel. Thus, the charging current Ic flowing in the parasitic capacitance Cel in the second sub pixel may be larger than the charging current Ic flowing in the parasitic capacitance Cel in the first sub pixel and the charging current Ic flowing in the parasitic capacitance Cel in the third sub pixel. As a result, it may be possible to reduce the time taken to charge the parasitic capacitance Cel in the second sub pixel. Therefore, it may be possible to avoid the failure of a pixel to represent a desired color due to the difference between the time points at which the driving current Ids starts flowing in the light-emitting element EL among the sub pixels. Accordingly, it may be possible to prevent or suppress a deterioration of the quality of the image viewed by the user.

Figure 17:
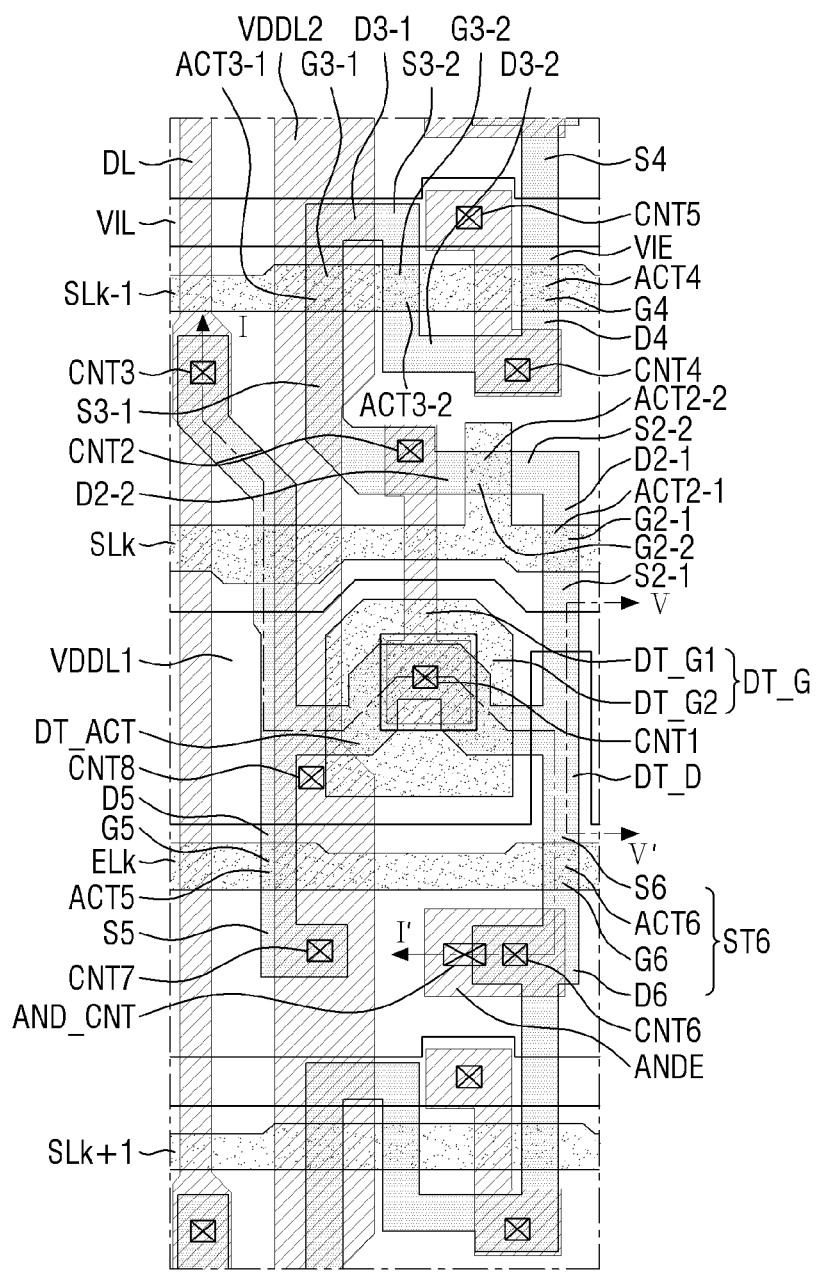
FIGS. 17 to 19 illustrate plan views showing first to third sub pixels according to an embodiment of the present disclosure.
Figure 18:
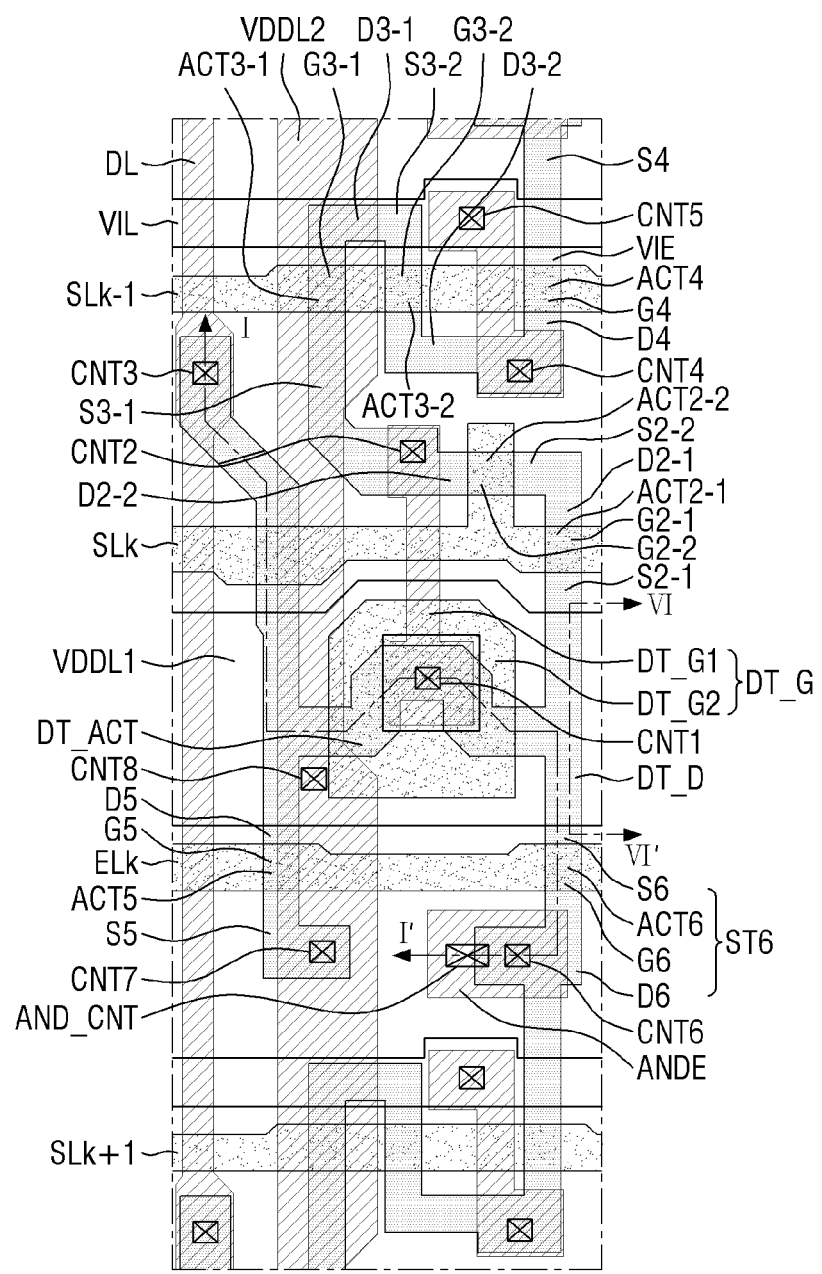
Figure 19:
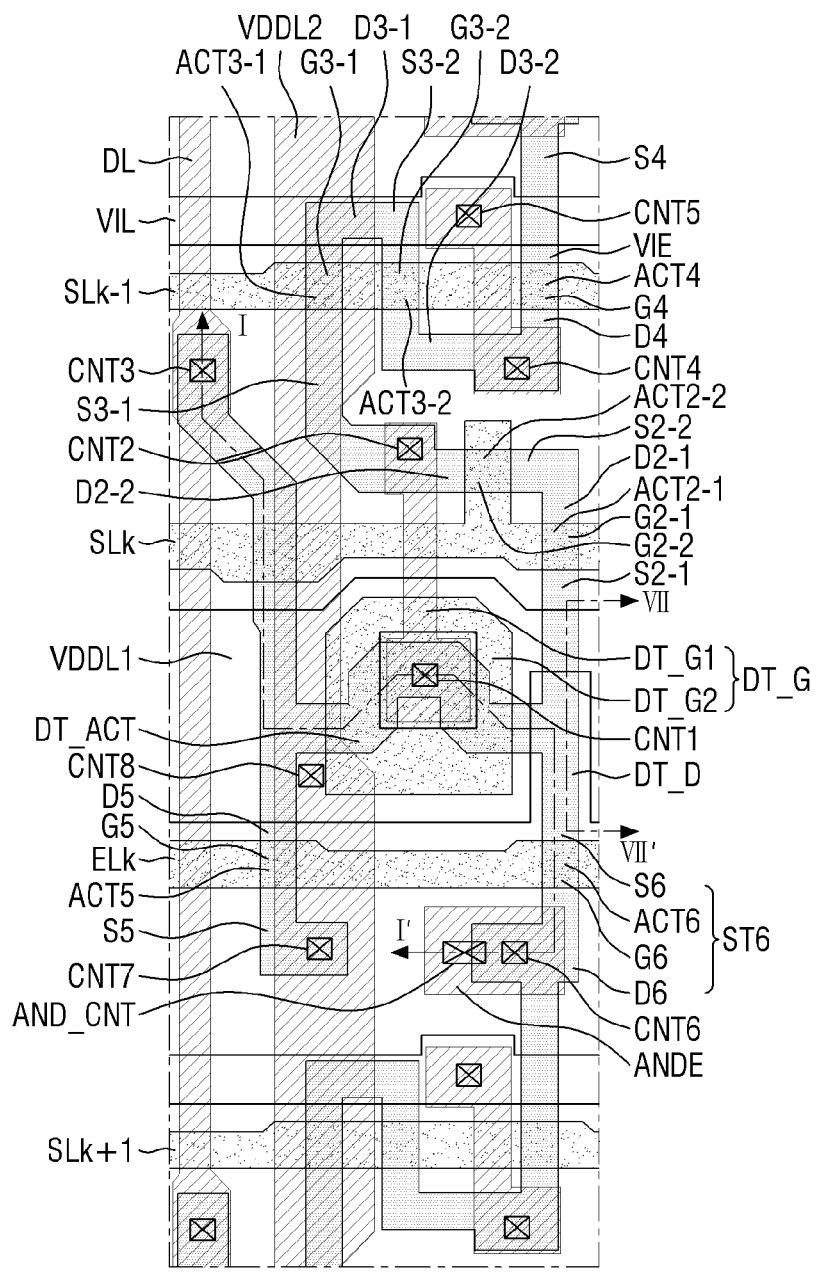

FIGS. 17 to 19 illustrate plan views showing first to third sub pixels according to an embodiment of the disclosure.

The embodiment shown in FIGS. 17 to 19 may be substantially identical to the embodiment shown in FIGS. 12 to 14 except that the first to third sub pixels SP1, SP2 and SP3 each have different areas where a second electrode DT_D of a driving transistor DT may overlap with a first sub supply voltage line VDDL1.

Referring to FIGS. 17 to 19, the area where the second electrode DT_D of the driving transistor DT overlaps with the first sub supply voltage line VDDL1 in the second sub pixel SP2 may be larger than the area where the second electrode DT_D of the driving transistor DT overlaps with the first sub supply voltage line VDDL1 in the first sub pixel SP1. Therefore, the capacitance of the first capacitor C1 of the second sub pixel SP2 may be larger than the capacitance of the first capacitor C1 of the first sub pixel SP1.

In addition, the area where the second electrode DT_D of the driving transistor DT overlaps with the first sub supply voltage line VDDL1 in the first sub pixel SP1 may be substantially identical to the area where the second electrode DT_D of the driving transistor DT overlaps with the first sub supply voltage line VDDL1 in the third sub pixel SP3. Therefore, the capacitance of the first capacitor C1 of the first sub pixel SP1 may be larger than the capacitance of the first capacitor C1 of the third sub pixel SP3.

As shown in FIG. 10, the time taken for charging the parasitic capacitance Cel with the driving current Ids may be the longest in the second sub pixel SP2, the second longest in the first sub pixel SP1, and the shortest in the third sub pixel SP3. Therefore, the capacitance of the first capacitor C1 of the second sub pixel SP2 may be the largest, the capacitance of the first capacitor C1 of the first sub pixel SP1 may be the second largest, and the capacitance of the first capacitor C1 of the third sub pixel SP3 may be the smallest. Thus, the charging current Ic flowing to the parasitic capacitance Cel in the second sub pixel may be the largest, the charging current Ic flowing to the parasitic capacitance Cel in the first sub pixel may be the second largest, and the charging current Ic flowing to the parasitic capacitance Cel in the third sub pixel may be the smallest. As a result, the time for charging the parasitic capacitance Cel may be reduced most in the second sub pixel, and the time for charging the parasitic capacitance Cel may be reduced second most in the first sub pixel. Therefore, it may be possible to overcome the problem that a pixel fails to represent a desired color due to the difference between the time points at which the driving current Ids starts flowing in the light-emitting element EL among the sub pixels. Accordingly, it may be possible to prevent or suppress a deterioration of the quality of the image viewed by the user.

Figure 20:
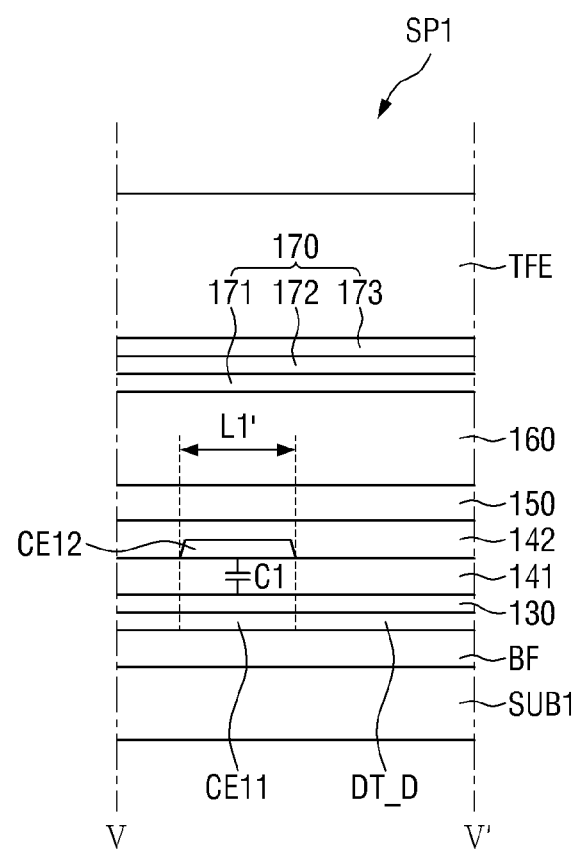
FIG. 20 illustrates a schematic cross-sectional view taken along line V-V' of FIG. 17.

FIG. 20 illustrates a cross-sectional view taken along line V-V' of FIG. 17.

The schematic cross-sectional view taken along line VI-VI' of FIG. 18 may be substantially identical to the schematic cross-sectional view shown in FIG. 16, taken along line III-III' of FIG. 13; and, therefore, the schematic cross-sectional view taken along line VI-VI' of FIG. 18 may not be shown. The schematic cross-sectional view taken along line VII-VII' of FIG. 19 may be substantially identical to the schematic cross-sectional view shown in FIG. 16, taken along line II-II' of FIG. 12; and, therefore, the schematic cross-sectional view taken along line VII-VII' of FIG. 19 may not be shown.

Referring to FIGS. 16 and 20, which may be a schematic cross-sectional view taken along line V-V' of FIG. 17 and which may be substantially identical to the cross-sectional view shown in FIG. 16, taken along line II-II' of FIG. 12, a length L2 of a first sub supply voltage line VDDL1 in a direction that overlaps with a second electrode DT_D of a driving transistor DT in a second sub pixel SP2 may be larger than a length L1' of the first sub supply voltage line VDDL1 that overlaps with the second electrode DT_D of the driving transistor DT in a first sub pixel SP1. The length L1' of the first sub supply voltage line VDDL1 that overlaps with the second electrode DT_D of the driving transistor DT in the first sub pixel SP1 may be larger than the length L of the first sub supply voltage line VDDL1 that overlaps with the second electrode DT_D of the driving transistor DT in the third sub pixel SP3.

Accordingly, the area where the second electrode DT_D of the driving transistor DT overlaps with the first sub supply voltage line VDDL1 in the second sub pixel SP2 may be larger than the area where the second electrode DT_D of the driving transistor DT overlaps with the first sub supply voltage line VDDL1 in the first sub pixel SP1. Therefore, the capacitance of the first capacitor C1 of the second sub pixel SP2 may be larger than the capacitance of the first capacitor C1 of the first sub pixel SP1.

In addition, the area where the second electrode DT_D of the driving transistor DT overlaps with the first sub supply voltage line VDDL1 in the first sub pixel SP1 may be substantially identical to the area where the second electrode DT_D of the driving transistor DT overlaps with the first sub supply voltage line VDDL1 in the third sub pixel SP3. Therefore, the capacitance of the first capacitor C1 of the first sub pixel SP1 may be equal to the capacitance of the first capacitor C1 of the third sub pixel SP3.

According to an embodiment shown in FIG. 20, the time taken for charging the parasitic capacitance Cel with the driving current Ids may be the longest in the second sub pixel SP2, the second longest in the first sub pixel SP1, and the shortest in the third sub pixel SP3. Therefore, the capacitance of the first capacitor C1 of the second sub pixel SP2 may be the largest, the capacitance of the first capacitor C1 of the first sub pixel SP1 may be the second largest, and the capacitance of the first capacitor C1 of the third sub pixel SP3 may be the smallest. Thus, the charging current Ic flowing to the parasitic capacitance Cel in the second sub pixel may be the largest than the charging current Ic flowing to the parasitic capacitance Cel in the first sub pixel may be the second largest, and the charging current Ic flowing to the parasitic capacitance Cel in the third sub pixel may be the smallest. As a result, the time for charging the parasitic capacitance Cel may be reduced most in the second sub pixel, and the time for charging the parasitic capacitance Cel may be reduced second most in the first sub pixel Therefore, it may be possible to overcome the problem that a pixel fails to represent a desired color due to the difference between the time points at which the driving current Ids starts flowing in the light-emitting element EL among the sub pixels. Accordingly, it may be possible to prevent or suppress a deterioration of the quality of the image viewed by the user.

While exemplary embodiments are described above, it is not intended that these embodiments describe all possible forms thereof. Rather, the words used in the specification are words of description rather than limitation, and it is understood that various changes may be made without departing from the spirit and scope of the of the disclosure. Additionally, the features of various embodiments may be combined to form further embodiments of the disclosure.

What is claimed is:

1. A display device comprising:
a first sub pixel emitting light of a first color; and
a second sub pixel emitting light of a second color,
wherein each of the first sub pixel and the second sub pixel comprises:
a driving transistor including a first electrode, a second electrode, and a gate electrode, the driving transistor configured to control an electric current flowing from the first electrode to the second electrode according to a data voltage applied to the gate electrode;

a light-emitting element connected to the second electrode of the driving transistor;

a first capacitor including a first electrode connected to a first sub supply voltage line to which a first supply voltage is applied and a second electrode connected to the second electrode of the driving transistor; and a second capacitor including a first electrode connected to the gate electrode of the driving transistor and a second electrode connected to the first sub supply voltage line, wherein an area where the first electrode of the first capacitor overlaps the second electrode of the first capacitor in the first sub pixel is different from an area where the first electrode of the first capacitor overlaps the second electrode of the first capacitor in the second sub pixel, and an area where the first electrode of the second capacitor overlaps the second electrode of the second capacitor in each of the first sub pixel and the second sub pixel is larger than the area where the first electrode of the first capacitor overlaps the second electrode of the first capacitor in each of the first sub pixel and the second sub pixel.

2. The display device of claim 1, wherein the area where the first electrode of the first capacitor overlaps the second electrode of the first capacitor in the first sub pixel is less than the area where the first electrode of the first capacitor overlaps the second electrode of the first capacitor in the second sub pixel.

3. The display device of claim 1, wherein a length of the first electrode of the first capacitor which overlaps the second electrode of the first capacitor in one direction in the first sub pixel is less than a length of the first electrode of the first capacitor overlaps the second electrode of the first capacitor in the one direction in the second sub pixel.

4. The display device of claim 1, further comprising:
a scan line extended in a first direction; and
a data line extended in a second direction intersecting the first direction,
wherein the first sub supply voltage line extends in the first direction.

5. The display device of claim 4, further comprising:
a second sub supply voltage line connected to the first sub supply voltage line,
wherein the second sub supply voltage line extends in the second direction.

6. The display device of claim 1, wherein the first color is a red or a blue, and the second color is a green.

7. A display device comprising:
a first sub pixel emitting light of a first color;
a second sub pixel emitting light of a second color; and
a third sub pixel emitting light of a third color, wherein each of the first sub pixel, the second sub pixel, and the third sub pixel comprises:
a driving transistor including a first electrode, a second electrode, and a gate electrode, the driving transistor configured to control an electric current flowing from the first electrode to the second electrode according to a data voltage applied to the gate electrode;
a light-emitting element connected to the second electrode of the driving transistor; and
a first capacitor that includes a first electrode connected to a first sub supply voltage line to which a first supply voltage is applied and a second electrode connected to the second electrode of the driving transistor; and a second capacitor including a first electrode connected to the gate electrode of the driving transistor and a second electrode connected to the first sub supply voltage line, and an area where the first electrode of the first capacitor overlaps the second electrode of the first capacitor in the first sub pixel, an area where the first electrode of the first capacitor overlaps the second electrode of the first capacitor in the second sub pixel, and an area where the first electrode of the first capacitor overlaps the second electrode of the first capacitor in the third sub pixel are different from each other, and an area where the first electrode of the second capacitor overlaps the second electrode of the second capacitor in each of the first sub pixel, the second sub pixel, and the third sub pixel is larger than the area where the first electrode of the first capacitor overlaps the second electrode of the capacitor in each of the first sub pixel, the second sub pixel, and the third sub pixel.

8. The display device of claim 7, wherein the area where the first electrode of the first capacitor overlaps the second electrode of the first capacitor in the first sub pixel is less than the area where the first electrode of the first capacitor overlaps the second electrode of the first capacitor in the second sub pixel.

9. The display device of claim 7, wherein the area where the first electrode of the first capacitor overlaps the second electrode of the first capacitor in the third sub pixel is less than the area where the first electrode of the first capacitor overlaps the second electrode of the first capacitor in the second sub pixel.

10. The display device of claim 7, wherein the area where the first electrode of the first capacitor overlaps the second electrode of the first capacitor in the third sub pixel is less than area where the first electrode of the first capacitor overlaps the second electrode of the first capacitor in the first sub pixel.

11. The display device of claim 7, wherein a length of the first electrode of the first capacitor which overlaps the second electrode of the first capacitor in one direction in the first sub pixel is less than a length of the first electrode of the first capacitor overlaps the second electrode of the first capacitor in the one direction in the second sub pixel.

12. The display device of claim 7, wherein a length of the first electrode of the first capacitor which overlaps the second electrode of the first capacitor in one direction in the third sub pixel is less than a length of the first electrode of the first capacitor overlaps the second electrode of the first capacitor in the one direction in the second sub pixel.

13. The display device of claim 7, wherein a length of the first electrode of the first capacitor which overlaps the second electrode of the first capacitor in one direction in the first sub pixel is equal to a length of the first electrode of the first overlaps the second electrode of the first capacitor in the one direction in the third sub pixel.

14. The display device of claim 7, wherein a length of the first electrode of the first capacitor which overlaps the second electrode of the first capacitor in one direction in the third sub pixel is less than a length of the first electrode of the first overlaps the second electrode of the first capacitor in the one direction in the first sub pixel.

15. The display device of claim 7, wherein the first color is a red, the second color is a green, and the third color is blue.

16. A display device comprising:
a first sub pixel emitting light of a first color;
a second sub pixel emitting light of a second color; and
a third sub pixel emitting light of a third color, wherein each of the first sub pixel, the second sub pixel, and the third sub pixel comprises:
a driving transistor including a first electrode, a second electrode, and a gate electrode, the driving transistor configured to control an electric current flowing from the first electrode to the second electrode according to a data voltage applied to the gate electrode;
a light-emitting element connected to the second electrode of the driving transistor; and
a first capacitor including a first electrode connected to a first sub supply voltage line to which a first supply voltage is applied and a second electrode connected to the second electrode of the driving transistor, an area where the first electrode of the first capacitor overlaps the second electrode of the first capacitor in the first sub pixel is different from an area where the first electrode of the first capacitor overlaps the second electrode of the first capacitor in the second sub pixel, an area where the first electrode of the first capacitor overlaps the second electrode of the first capacitor in the third sub pixel is different from an area where the first electrode of the first capacitor overlaps the second electrode of the first capacitor in the second sub pixel, and the area where the first electrode of the first capacitor overlaps the second electrode of the first capacitor in the first sub pixel is equal to the area where the first electrode of the first capacitor overlaps the second electrode of the first capacitor in the third sub pixel.

* * * * *